(12) United States Patent
Takahashi et al.

(10) Patent No.: US 8,642,940 B2
(45) Date of Patent: Feb. 4, 2014

(54) DISPLAY DEVICE AND MANUFACTURING METHOD THEREOF

(71) Applicant: Seminconductor Energy Laboratory Co., Ltd., Kanagawa-ken (JP)

(72) Inventors: Yasuyuki Takahashi, Kanagawa (JP); Mizuki Sato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/919,331

(22) Filed: Jun. 17, 2013

(65) Prior Publication Data

US 2013/0320364 A1 Dec. 5, 2013

Related U.S. Application Data

(60) Continuation of application No. 13/668,844, filed on Nov. 5, 2012, now Pat. No. 8,466,404, which is a continuation of application No. 13/158,737, filed on Jun. 13, 2011, now Pat. No. 8,304,710, which is a division of application No. 12/466,944, filed on May 15, 2009, now Pat. No. 7,960,678, which is a continuation of application No. 11/651,176, filed on Jan. 9, 2007, now Pat. No. 7,534,985.

(30) Foreign Application Priority Data

Jan. 10, 2006 (JP) ................................. 2006-002841

(51) Int. Cl.
*H01L 27/00* (2006.01)
*G09G 3/30* (2006.01)

(52) U.S. Cl.
USPC ......... 250/208.2; 250/214.1; 257/72; 345/76; 349/44

(58) Field of Classification Search
USPC ........... 250/208.1, 208.2, 214.1, 216; 345/55, 345/76; 349/44, 46, 69; 257/72, 77, 91
See application file for complete search history.

(56) References Cited

U.S. PATENT DOCUMENTS

| | | | |
|---|---|---|---|
| 6,072,450 | A | 6/2000 | Yamada et al. |
| 6,114,715 | A | 9/2000 | Hamada |
| 6,320,325 | B1 | 11/2001 | Cok et al. |

(Continued)

FOREIGN PATENT DOCUMENTS

| | | |
|---|---|---|
| EP | 1 282 101 A1 | 2/2003 |
| JP | 2000-98409 | 4/2000 |

(Continued)

*Primary Examiner* — Kevin Pyo
(74) *Attorney, Agent, or Firm* — Husch Blackwell LLP

(57) ABSTRACT

A display device in which light leakage in a monitor element portion is prevented without increasing the number of steps and cost is provided. The display device includes a monitor element for suppressing influence on a light-emitting element due to temperature change and change over time and a TFT for driving the monitor element, in which the TFT for driving the monitor element is provided so as not to overlap the monitor element. Furthermore, the display device includes a first light shielding film and a second light shielding film, in which the first light shielding film is provided so as to overlap a first electrode of the monitor element and the second light shielding film is electrically connect to the first light shielding film through a contact hole formed in an interlayer insulating film. The contact hole is formed so as to surround the outer edge of the first electrode of the monitor element.

21 Claims, 14 Drawing Sheets

(56) References Cited

U.S. PATENT DOCUMENTS

| | | |
|---|---|---|
| 6,414,443 B2 | 7/2002 | Tsuruoka et al. |
| 6,445,005 B1 | 9/2002 | Yamazaki et al. |
| 6,528,824 B2 | 3/2003 | Yamagata et al. |
| 6,528,951 B2 | 3/2003 | Yamazaki et al. |
| 6,593,691 B2 | 7/2003 | Nishi et al. |
| 6,597,121 B2 | 7/2003 | Imura |
| 6,900,784 B2 | 5/2005 | Tsuchida |
| 7,081,704 B2 | 7/2006 | Yamazaki et al. |
| 7,180,515 B2 | 2/2007 | Miyagawa et al. |
| 7,329,985 B2 | 2/2008 | Yamazaki et al. |
| 7,365,494 B2 | 4/2008 | Sato |
| 7,453,453 B2 | 11/2008 | Miyagawa et al. |
| 7,489,072 B2 | 2/2009 | Yang et al. |
| 7,534,985 B2 | 5/2009 | Takahashi et al. |
| 7,773,082 B2 | 8/2010 | Miyagawa et al. |
| 7,830,080 B2 | 11/2010 | Tanada |
| 7,999,769 B2 | 8/2011 | Miyagawa et al. |
| 8,466,404 B2 * | 6/2013 | Takahashi et al. ......... 250/208.2 |
| 2001/0004190 A1 | 6/2001 | Nishi et al. |
| 2001/0030511 A1 | 10/2001 | Yamazaki et al. |
| 2001/0033252 A1 | 10/2001 | Yamazaki et al. |
| 2002/0044237 A1 | 4/2002 | Wada et al. |
| 2003/0132716 A1 | 7/2003 | Yamazaki et al. |
| 2004/0256997 A1 | 12/2004 | Fukumoto et al. |
| 2005/0012731 A1 | 1/2005 | Yamazaki et al. |
| 2005/0017963 A1 | 1/2005 | Yamazaki et al. |
| 2005/0017964 A1 | 1/2005 | Yamazaki et al. |
| 2007/0159099 A1 | 7/2007 | Takahashi et al. |
| 2008/0170028 A1 | 7/2008 | Yoshida |
| 2008/0179594 A1 | 7/2008 | Oh |
| 2009/0224261 A1 | 9/2009 | Takahashi et al. |
| 2011/0278579 A1 | 11/2011 | Miyagawa et al. |

FOREIGN PATENT DOCUMENTS

| | | |
|---|---|---|
| JP | 2002-83689 | 3/2002 |
| JP | 2002-132186 | 5/2002 |
| JP | 2004-94236 | 3/2004 |
| JP | 2004-170943 | 6/2004 |
| JP | 3696116 | 9/2005 |
| WO | WO 2004/040541 A1 | 5/2004 |

\* cited by examiner

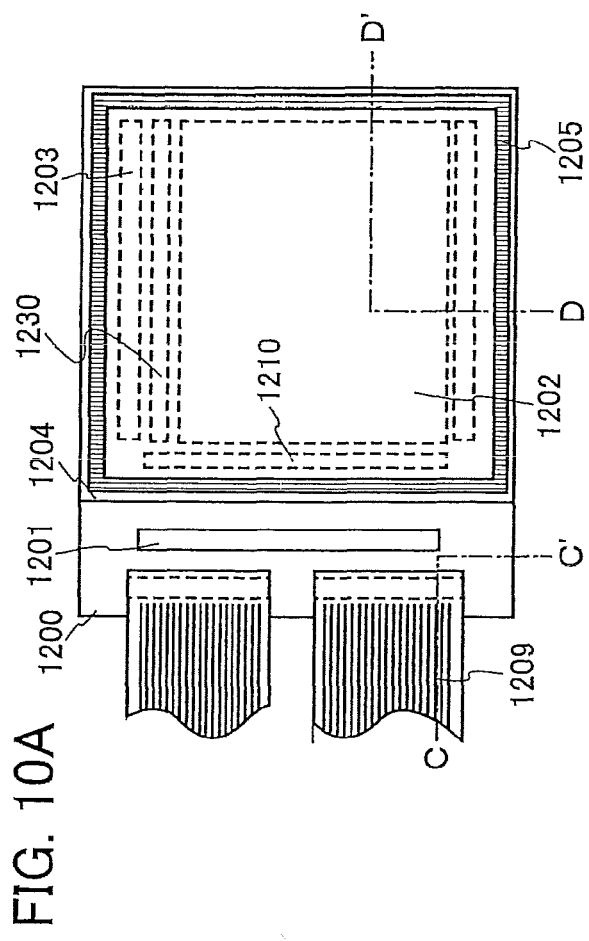
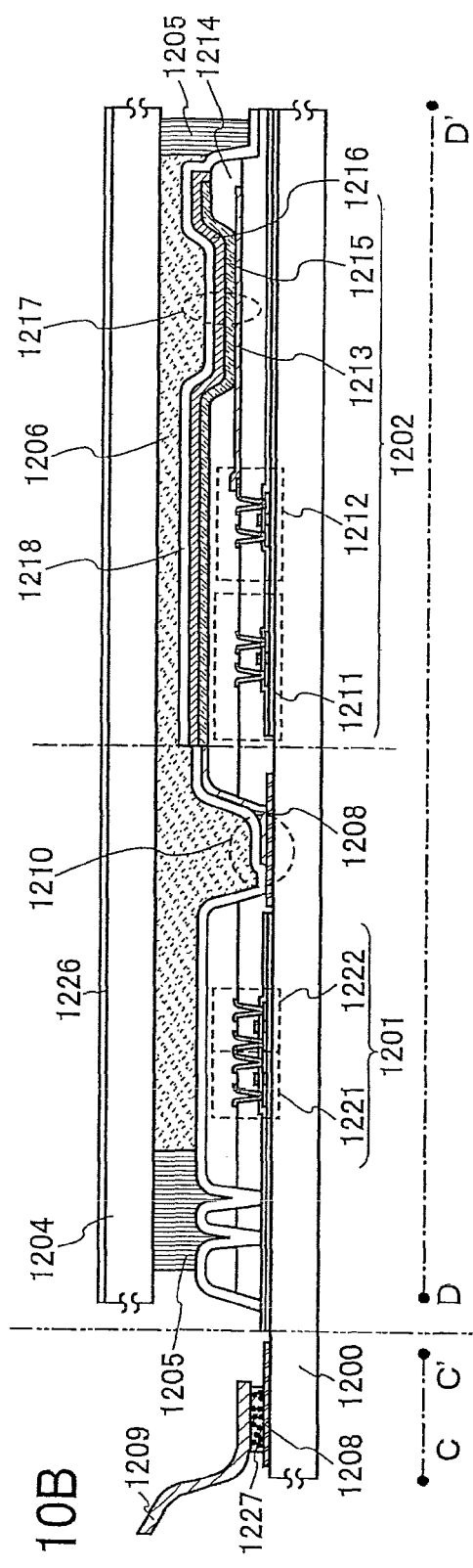
FIG. 10A
FIG. 10B

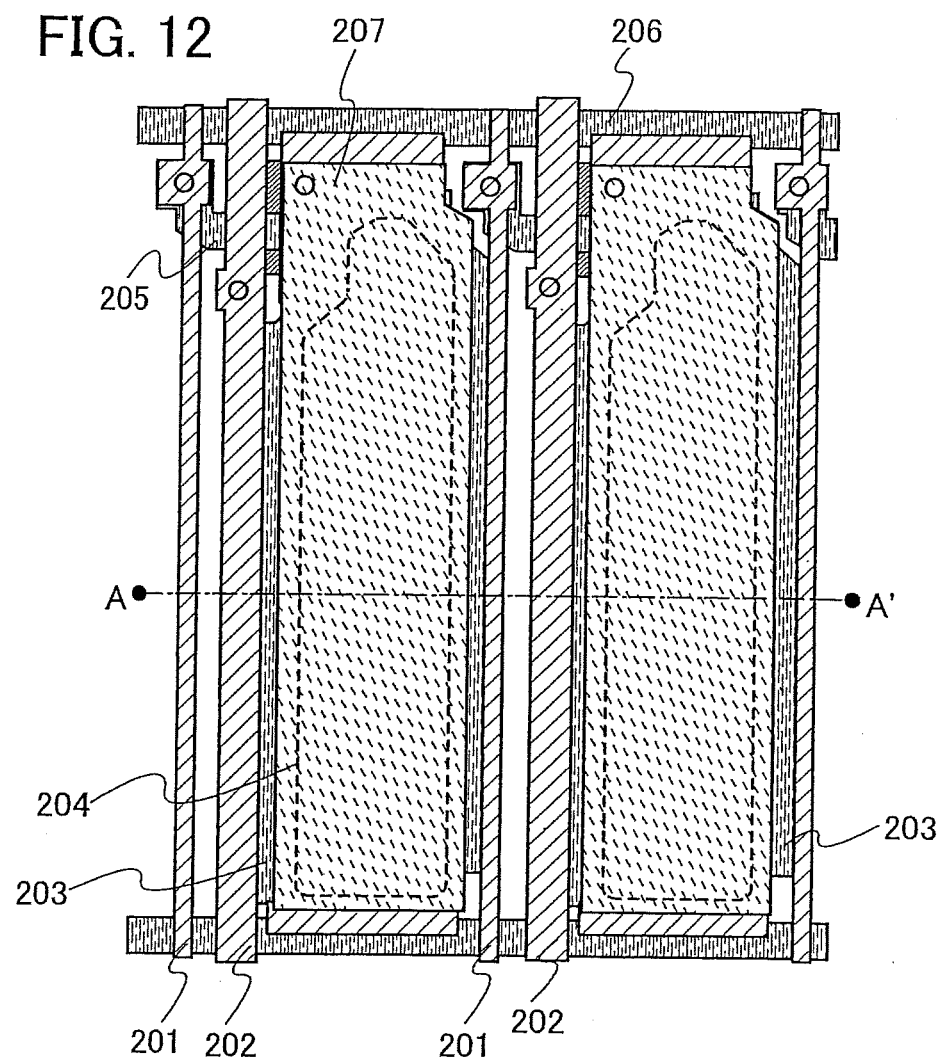

DISPLAY DEVICE AND MANUFACTURING METHOD THEREOF

This application is a continuation of copending U.S. application Ser. No. 13/668,844, filed on Nov. 5, 2012 which is a continuation of U.S. application Ser. No. 13/158,737, filed on Jun. 13, 2011 (now U.S. Pat. No. 8,304,710 issued Nov. 6, 2012) which is a divisional of U.S. application Ser. No. 12/466,944, filed on May 15, 2009 (now U.S. Pat. No. 7,960,678 issued Jun. 14, 2011) which is a continuation of U.S. application Ser. No. 11/651,176, filed on Jan. 9, 2007 (now U.S. Pat. No. 7,534,985 issued May 19, 2009), all which are incorporated herein by reference.

BACKGROUND OF THE INVENTION

1. Field of the Invention

The present invention relates to a display device using a semiconductor element (an element including a semiconductor thin film). In particular, the present invention relates to an active matrix type display device using an electroluminescence (Electro Luminescence: EL) element and a thin film transistor (hereinafter, referred to as "TFT"). Furthermore, the present invention relates to an electronic appliance in which a display device is used in its display portion.

2. Description of the Related Art

A so-called self-light-emitting display device in which a pixel is formed using a light-emitting element such as a light-emitting diode (LED) has received attention in recent years. As the light-emitting element used in such a self-light-emitting display device, an organic light-emitting diode (OLED, also referred to as an organic EL element, an electroluminescence (Electro Luminescence: EL) element, or the like; hereinafter, referred to as an EL element in this specification) has attracted attention, and is used for an organic EL display, and the like.

Since an EL element is a self-light-emitting element which has an electroluminescent layer between a pair of electrodes and which emits light by current flown between the electrodes, it has advantages over a liquid crystal display that visibility of a pixel is high, backlight is not necessary, and response speed is high. Luminance of the light-emitting element is controlled by a current value flowing to the light-emitting element.

The light-emitting element has properties in which a resistance value (internal resistance value) is changed by an environmental temperature (hereinafter, referred to as ambient temperature). In particular, when a room temperature is regarded as a normal temperature, the resistance value is decreased as the temperature becomes higher than the normal temperature, and the resistance value is increased as the temperature becomes lower than the normal temperature. Therefore, in a constant voltage drive, when the temperature becomes high, a current value is increased and luminance higher than desired luminance is obtained, whereas when the temperature becomes low, a current value is decreased and luminance lower than desired luminance is obtained. The light-emitting element which has been used recent years has properties in which a current value is decreased with time even if a predetermined voltage is applied.

Due to the properties of the light-emitting element mentioned above, variation in luminance is generated when the ambient temperature is changed or change of a current over time is occurred. In order to solve the problem of luminance variation in a light-emitting element due to the ambient temperature change and change of a current over time, it is proposed to provide a monitor element (for example, refer to patent document 1: Japanese Patent No. 3696116). One of electrodes of the monitor element is connected to a constant-current source and the input (an input terminal) of an amplifier circuit, while the output (the output terminal) of the amplifier circuit is connected to one of the electrodes of a light-emitting element provided in a pixel in a pixel portion. According to such a structure, the current flowing through the light-emitting element of the pixel is kept constant based on the temperature characteristic of the monitor element. In this specification, "being connected" means not only a direct connection but also an electrical connection. Thus, an element and a wiring may be additionally formed between objects to be connected to each other. In addition, in this specification, "overlapping" means not only the case where elements included in a display device (such as an insulating film or a wiring) are overlapped in direct contact with each other, but also the case where the elements are overlapped with each other with another element interposed therebetween.

According to the foregoing structure, current flowing through the light-emitting element in the pixel can be kept constant even if the temperature of the light-emitting element (electroluminescent layer) is changed. Accordingly, the power consumption of the display device can be prevented from increasing and luminance can also be kept constant even if the ambient temperature of the display device is increased.

SUMMARY OF THE INVENTION

Since the monitor element is not used for displaying an image, a region provided with the monitor element (monitor element portion) is required to be shielded so that light generated in the monitor element is not leaked. As a method for solving light leakage, there is a method to provide a light shielding film. Alternatively, there is a method to provide an uneven part on a reflecting surface of a cathode (a surface being in contact with a light-emitting layer side) of the monitor element to scatter reflected light at the reflecting surface of the cathode.

An example of a structure of a light shielding film provided in a monitor element portion is described with reference to FIGS. 12 to 14. FIG. 12 shows the layout of the monitor element portion, and FIG. 13A shows a cross-sectional structure taken along a chained line A-A' in FIG. 12. Although the same monitor element portion as FIG. 12 is shown in FIG. 14, a first electrode 207 is omitted in a region surrounded by a dotted line 212, and the first electrode 207, a current supply line 202, a light shielding film 214, and a drain electrode 215 are omitted in the region surrounded by a dotted line 213, so as to give a simplified illustration of the location and the like of a TFT for driving the monitor element.

In the monitor element portion, each region surrounded by a control line 201 which supplies potential to a gate line of a TFT 221 for driving a monitor element and a gate line 206 of a TFT provided in a light-emitting element in the pixel portion, is provided with the monitor element and the TFT for driving the monitor element (FIG. 14). The monitor element includes the first electrode 207 (an anode or a cathode), an electroluminescent layer 208, and a second electrode 209 (a cathode or an anode) (FIG. 13A). A region 204 surrounded by the dotted line in FIGS. 12 to 14 shows a region where the monitor element including an anode, the electroluminescent layer 208, and a cathode emits light. The gate line 205 of the TFT for driving the monitor element is overlapped with the first electrode 207 of the monitor element portion (FIG. 12). The TFT 221 is formed in the region surrounded by the control line 201 and the gate line 206, and the gate line 205 of the TFT 221 is formed in the same layer as a light shielding film 203; therefore, the light shielding film 203 is required to be formed so as not to overlap the TFT 221 (FIG. 14). Therefore, it has been difficult to form light shielding film 203 with an adequate size and shape to block light. As a result, light generated in the monitor element is leaked from a gap between the TFT 221 and the light shielding film 203. In addition, as shown in FIG. 13A, light is also leaked from a region which corresponds to a gap between the current supply line 202 which connects a source region of the TFT for driving the monitor element and a constant current source, and the control line 201 which supplies potential to the gate line of the TFT for driving the monitor element. In FIGS. 13A and 13B, a reference numeral 210 denotes an interlayer insulating film, and a reference numeral 211 denotes an insulating film. Besides, a structure shown in FIG. 13B, in which two interlayer insulating films 210 and 220 are provided can be considered, but in that case, light is also leaked from a region which corresponds to a gap between the current supply line 202 and the control line 201.

This light leakage can be prevented by lowering the aperture ratio of the monitor element portion. However, the aperture ratio of the monitor element portion and that of the pixel portion are desirably at a comparable level in view of deterioration characteristics of a light-emitting element. Thus, it is not desirable to employ a structure in which the aperture ratio of the monitor element portion is lowered to achieve an original purpose to compensate the change of the current flown through the light emitting element due to the change of the temperature of the light-emitting element and the deterioration of the characteristic of the light emitting element over time.

In view of the foregoing problems, it is an object of the present invention to provide a display device in which light leakage in the monitor element portion is prevented without increasing the number of steps and cost.

A display device of the present invention includes a monitor element for suppressing influence on a light-emitting element due to temperature change and deterioration of the light-emitting element over time and a TFT for driving the monitor element; in which the TFT for driving the monitor element is provided so as not to be overlapped with the monitor element. Furthermore, a display device of the present invention includes a first light shielding film and a second light shielding film; in which the first light shielding film is provided so as to overlap a first electrode of the monitor element and the second light shielding film is electrically connected to the first light shielding film through a contact hole formed in an interlayer insulating film. The contact hole is formed so as to surround the outer edge of the first electrode of the monitor element. Note that "monitor element portion" in this specification refers to a whole region provided with a monitor element.

A display device having a light-emitting element to which the present invention is applicable is an active matrix type. Further, as a type of light emission from the light-emitting element, a bottom emission type or a dual emission type is applicable.

The first light shielding film is formed at the same time and under the same manufacturing condition as a gate line of the monitor element and a gate line of the light-emitting element provided in a pixel portion. The second light shielding film is formed at the same time and under the same manufacturing condition as a source line of the monitor element and a source line of the light-emitting element provided in the pixel portion.

A display device of the present invention includes a plurality of pixels, a source line driver circuit (source driver), and a gate line driver circuit (gate driver). Each of the plural pixels includes a light-emitting element, a first thin film transistor for controlling an input of a video signal to the pixel, a second thin film transistor for controlling lighting or non-lighting of the light-emitting element, and a capacitor element holding a video signal. The capacitor element is not necessarily provided, and the gate capacitance of the second thin film transistor can be used as a substitute for the capacitor element.

The monitor element portion (a region provided with a monitor element) may be located in a pixel portion or in a region other than the pixel portion. However, in order not to influence image display and in order to put the monitor element portion in the same environment as the light-emitting element in the pixel portion as much as possible, the monitor element portion is desirably provided close to the pixel portion.

Further, the number of monitor elements can be appropriately selected. That is, both a structure having only one monitor element and a structure having a plurality of elements are acceptable. When only one monitor element is used, power consumption can be suppressed since a current value to be applied to the constant current source is set to be a current value to be applied to the light-emitting element of each pixel. When more than one monitor element are provided, variation in characteristics among monitor elements can be averaged.

When using a panel including a light-emitting element for color display, electroluminescent layers with different light-emitting wavelength ranges are preferably provided in pixels. Typically, electroluminescent layers corresponding to colors of red (R), green (G), and blue (B) are preferably provided. In this case, monitor elements each corresponding to red, green, and blue are provided so that power supply voltage can be corrected with respect to each color. In this case, a structure in which one monitor element is provided for each color may be applied; but preferably, a structure in which a plurality of elements is provided for each color is applied.

A structure of the present invention disclosed in this specification relating to a display device includes a pixel portion including a plurality of pixels arranged in matrix having a light-emitting element and a first thin film transistor for driving the light-emitting element; a monitor element having a first electrode, an electroluminescent layer formed over the first electrode, and a second electrode formed over the electroluminescent layer; a second thin film transitory for driving the monitor element; a constant current source for flowing a constant current to the monitor element; and an amplifier circuit. In the structure, the constant current source is electrically connected to one of a source electrode and a drain electrode of the second thin film transistor and to the input of the amplifier circuit, the other one of the source electrode and the drain electrode connected to the second thin film transistor is electrically connected to the first electrode of the monitor element, and one of electrodes of the light-emitting element is electrically connected to the output of the amplifier circuit through the first thin film transistor. Further, in the structure, the monitor element and the second thin film transistor are provided so as not to overlap each other, a first light shielding film is provided so as to overlap the first electrode of the monitor element, a second light shielding film is provided so as to overlap the first light shielding film, and the second light shielding film is electrically connected to the first light shielding film through a contact hole which is formed in an interlayer insulating film so as to surround the outer edge of the first electrode of the monitor element.

Another structure of the present invention disclosed in this specification relating to a display device includes a pixel portion including a plurality of pixels arranged in matrix having a light-emitting element and a first thin film transistor for driving the light-emitting element; a monitor element portion including a monitor element having a first electrode, an electroluminescent layer formed over the first electrode, and a second electrode formed over the electroluminescent layer, and including a second thin film transistor for driving the monitor element; a constant current source for flowing a constant current to the monitor element; and an amplifier circuit. In the structure, the constant current source is electrically connected to one of a source electrode and a drain electrode of the second thin film transistor and to the input of the amplifier circuit, the other one of the source electrode and the drain electrode connected to the second thin film transistor is electrically connected to the first electrode of the monitor element, and one of electrodes of the light-emitting element is electrically connected to the output of the amplifier circuit through the first thin film transistor. In addition, the monitor element portion includes a first light shielding film formed of the same material as a gate line, an interlayer insulating film formed over the first light shielding film, a second light shielding film formed of the same material as the source electrode or the drain electrode and formed over the interlayer insulating film, and the monitor element formed over the interlayer insulating film. Further, the monitor element and the second thin film transistor are provided so as not to overlap each other; the first light shielding film is provided to overlap the first electrode of the monitor element with the interlayer insulating film interposed therebetween, and the first electrode of the monitor element is electrically connected to the first light shielding film through a contact hole formed in the interlayer insulating film; and the second light shielding film is provided so as to overlap the first light shielding film with the interlayer insulating film interposed therebetween, and the second light shielding film is electrically connected to the first light shielding film through a contact hole formed in the interlayer insulating film so as to surround the outer edge of the first electrode of the monitor element.

Another structure of the present invention disclosed in this specification relating to a display device includes a pixel portion including a plurality of pixels arranged in matrix having a light-emitting element and a first thin film transistor for driving the light-emitting element; a monitor element portion including a monitor element having a first electrode, an electroluminescent layer formed over the first electrode, and a second electrode formed over the electroluminescent layer, and including a second thin film transistor for driving the monitor element; a constant current source for flowing a constant current to the monitor element; and an amplifier circuit. In the structure, the constant current source is electrically connected to one of a source electrode and a drain electrode of the second thin film transistor and to the input of the amplifier circuit; the other one of the source electrode and the drain electrode connected to the second thin film transistor is electrically connected to the first electrode of the monitor element, and one of electrodes of the light-emitting element is electrically connected to the output of the amplifier circuit through the first thin film transistor. In addition, the monitor element portion includes a first light shielding film formed of the same material as a gate line, a first interlayer insulating film formed over the first light shielding film, a second light shielding film formed of the same material as the source electrode or the drain electrode and formed over the first interlayer insulating film, a second interlayer insulating film formed over the second light shielding film and the source electrode or the drain electrode, and the monitor element formed over the second interlayer insulating film. Further, the monitor element and the second thin film transistor are provided so as not to overlap each other; the first light shielding film is provided to overlap the first electrode of the monitor element with the first interlayer insulating film and the second interlayer insulating film interposed therebetween, and the first electrode of the monitor element is electrically connected to the first light shielding film through a contact hole formed in the first interlayer insulating film and the second interlayer insulating film; and the second light shielding film is provided so as to overlap the first light shielding film with the first interlayer insulating film interposed therebetween, and the second light shielding film is electrically connected to the first light shielding film through a contact hole formed in the first interlayer insulating film so as to surround the outer edge of the first electrode of the monitor element.

In the foregoing structure of the present invention, the monitor element and the second thin film transistor are provided in different regions with the gate line interposed therebetween.

In the foregoing structure of the present invention, the second light shielding film has an annular shape.

In the foregoing structure of the present invention, the monitor element and the second thin film transistor are provided close to the pixel portion.

In the foregoing structure of the present invention, the pixel portion has a plurality of pixels which emit red light, a plurality of pixels which emit green light, and a plurality of pixels which emit blue light; and the monitor element and the thin film transistor for driving the monitor element are provided for each color.

In the foregoing structure of the present invention, the monitor element and the light-emitting element are EL elements.

In the foregoing structure of the present invention, the monitor element and the light-emitting element are formed using the same material and by the same process.

In the foregoing structure of the present invention, the amplifier circuit is a voltage follower circuit.

In the foregoing structure of the present invention, the display device is a bottom emission type or a dual emission type.

Another structure of the present invention disclosed in this specification relating to a display device is EL television having the foregoing display device.

Another structure of the present invention disclosed in this specification relating to a manufacturing method of a display device includes forming a base film over a substrate, forming a thin film transistor driving a monitor element by forming a semiconductor layer over the base film, forming a gate insulating film over the semiconductor layer, forming a gate line and a first light shielding film over the gate insulating film at the same time, and forming a source region and a drain region by doping the semiconductor layer with an impurity using the gate line as a mask. In addition, an interlayer insulating film is formed over the gate insulating film, the gate line, and the first light shielding film, then a second light shielding film is formed so as to be connected to the drain region and electrically connected to the first light shielding film through a contact hole formed in the interlayer insulating film so as to surround the outer edge of the first electrode of a monitor element, at the same time as forming a source line connected to the source region; the monitor element is formed over the interlayer insulating film by forming a first electrode so as to overlap the first light shielding film with the interlayer insulating film interposed therebetween; forming an electroluminescent layer over the first electrode; and forming a second electrode over the electroluminescent layer. In the foregoing structure, the monitor element is not overlapped with the thin film transistor for driving the monitor element.

In the present invention, the first light shielding film is provided to overlap the first electrode of the monitor element, and the second light shielding film is electrically connected to the first light shielding film through the contact hole formed in the interlayer insulating film. The contact hole is formed so as to surround the outer edge of the first electrode of the monitor element. Therefore, light leakage can be prevented by the first light shielding film and the second light shielding film as well as light leakage from a gap between first light shielding film and the second light shielding film.

In addition, the first light shielding film is formed using a conductive film which is used for forming the gate line of the TFT for driving the monitor element. Further, the second light shielding film to be electrically connected to the first light shielding film is formed using a conductive film which is used for forming the source electrode or the drain electrode. Since the light shielding films are formed at the same time as another wiring in such a manner, they can be formed without increasing the number of steps. In addition, a display device with high reliability and high yield can be provided at low cost.

BRIEF DESCRIPTION OF DRAWINGS

FIGS. 10A and 10B show a top view and a cross-sectional view illustrating a structure of a display device of the present invention, respectively;

FIG. 12 shows a layout of a monitor pixel (comparative example);

DETAILED DESCRIPTION OF THE INVENTION

Figure 1:
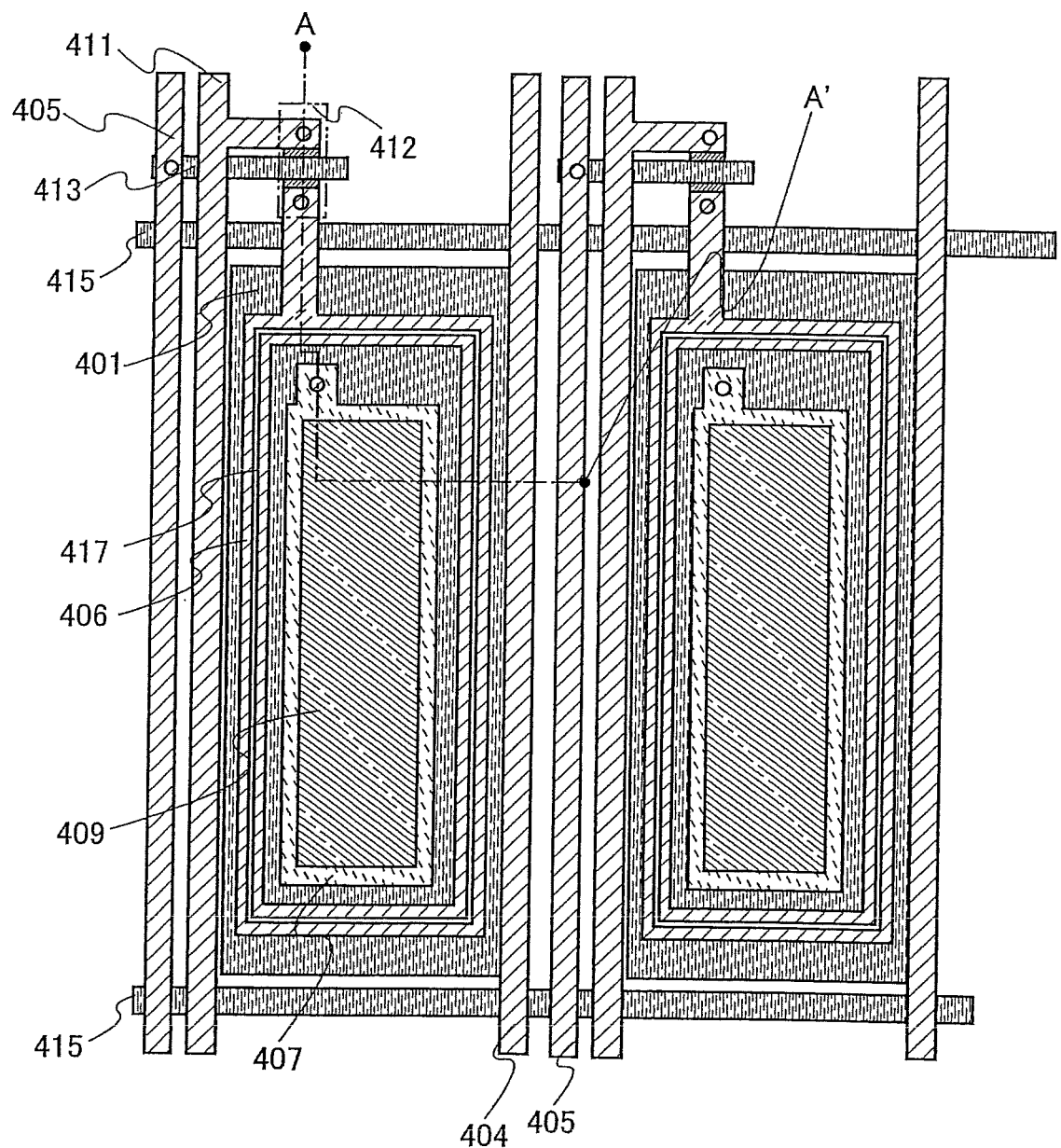
FIG. 1 shows a layout of a monitor pixel of the present invention.

Hereinafter, the best modes for carrying out the present invention are described with reference to the accompanying drawings. However, the present invention is not limited to the following description, and it is easily understood by those skilled in the art that modes and details herein disclosed can be modified in various ways without departing from the purpose and the scope of the present invention. Accordingly, the present invention should not be interpreted as being limited to the description of the embodiment modes to be given below. Note that like portions or portions having similar functions in the different drawings are denoted by the like reference numerals when describing the structure of the present invention with reference to the drawings, and repeated explanations thereof are omitted.

Embodiment Mode 1

In this embodiment mode, characteristics of a light shielding film provided in a monitor element portion are described.

Figure 2A:
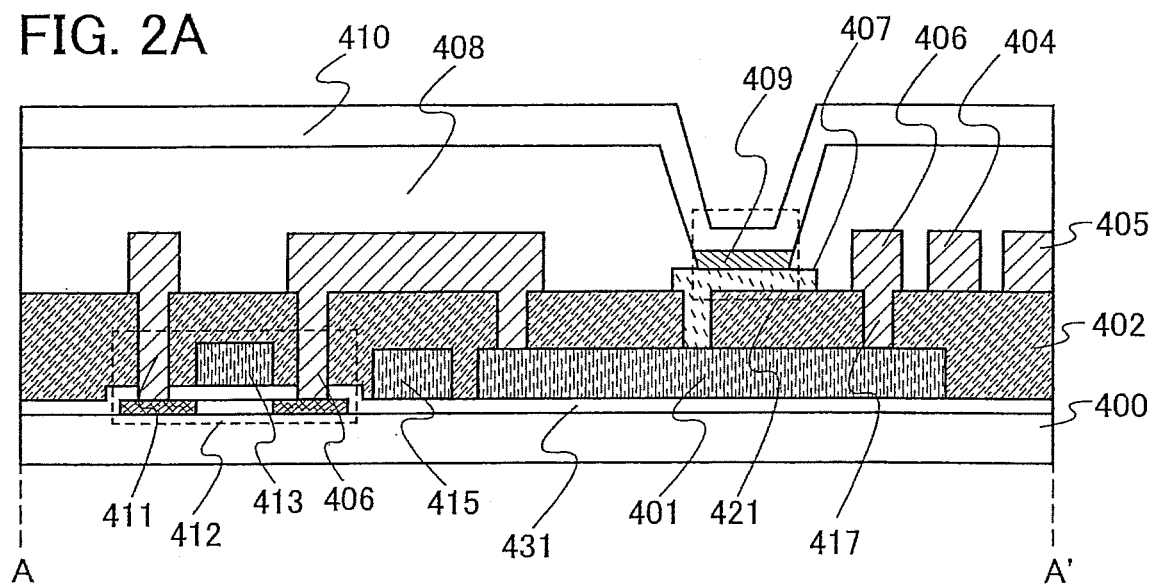
FIGS. 2A and 2B show cross-sectional views of a monitor pixel of the present invention.

A layout diagram of a region where a monitor element is provided is shown in FIG. 1. In addition, a cross-sectional structure taken along a chained line A-A' in FIG. 1 is shown in FIG. 2A.

A first light shielding film 401 is a conductive film formed using the same material and in the same step as a gate line 415 connected to a gate driver and as a gate line 413 of a TFT 412 for driving a monitor element, all of which are formed over a substrate 400. The first light shielding film 401 is provided so as to overlap a first electrode 407 of the monitor element. Although in FIG. 1, the first light shielding film 401 is provided so as not to overlap a current supply line 411 electrically connected to a constant current source, the first light shielding film 401 may be provided so as to overlap the current supply line 411. In addition, although in FIG. 1, the first light shielding film 401 is provided so as to overlap a wiring 404, the first light shielding film 401 may be provided so as not to overlap the wiring 404.

A second light shielding film 406 is a conductive film formed using the same material and in the same step as the current supply line 411 which electrically connects the constant current source and a source region (or a drain region) of the TFT 412 for driving the monitor element, as the wiring 404, and as a control line 405 applying potential to the gate line 413 of the TFT 412 for driving the monitor element. The second light shielding film 406 also serves as a drain electrode (or a source electrode) connected to the TFT 412 for driving the monitor element. The second light shielding film 406 has an annular shape and is provided so as to surround the outer edge of the first electrode 407. By providing the second light shielding film 406 in this manner, a region in the first electrode 407 which is not covered only with the first light shielding film 401 can be also covered. Note that in FIGS. 2A and 2B, a reference numeral 408 denotes an insulating film (also referred to as a bank, a partition, a barrier, a mound, or the like), a reference numeral 410 denotes a second electrode of the monitor element, and a reference numeral 431 denotes a gate insulating film of the TFT 412.

In this embodiment mode, the second light shielding film 406 also serves as the drain electrode (or the source electrode) of the TFT 412 for driving the monitor element, but the present invention is not limited to this structure. That is, a structure shown in FIG. 3A may be employed, in which the first light shielding film 401 and a drain electrode (or a source electrode) 432 connected to the TFT 412 are formed as different films and the drain electrode (or the source electrode) 432 is electrically connected to the second light shielding film 406 through the first light shielding film 401. The second light shielding film 406 has an annular shape similarly to that in FIG. 2A and is provided so as to surround the outer edge of the first electrode 407. In addition, the drain electrode (or the source electrode) 432 and the second light shielding film 406 may be formed using the same material and in the same step.

Figure 3A:
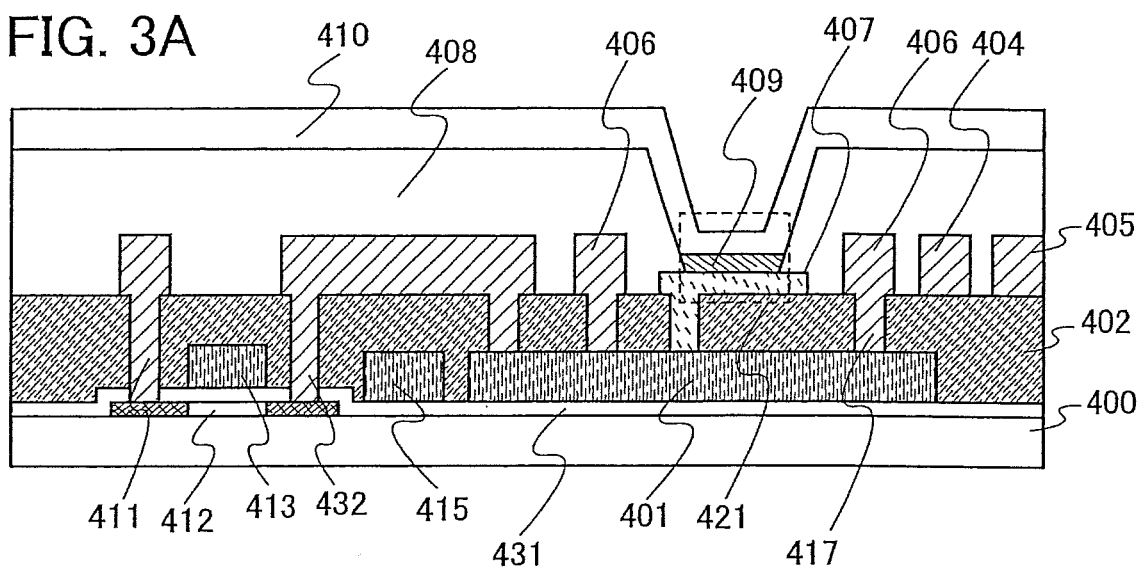
FIGS. 3A and 3B show cross-sectional views of a monitor pixel of the present invention.

The first electrode 407 is one of the electrodes to apply potential to an electroluminescent layer 409, and serves as an anode or a cathode. In FIGS. 2A and 3A, a light-emitting region 421 indicated by a dotted line is a region where a light-emitting element emits light when potential is applied to each of the first electrode 407 and the second electrode 410.

In this embodiment mode, in a bottom emission type display device, in a pixel portion including a plurality of pixels, a plurality of monitor elements is formed in a region adjacent to each of the even-numbered (odd-numbered) rows, and a plurality of TFTs is for driving the plurality of monitor elements is formed in a region adjacent to each of the odd-numbered (even-numbered) rows. Further, the monitor element and the TFT for driving the monitor element are provided in different regions from each other with the gate line therebetween. In other words, the monitor element and the TFT for driving the monitor element are provided so as not to overlap each other. In addition, to prevent the leakage of light emitted from the monitor element, the first light shielding film 401 is overlapped with the first electrode 407, and the first light shielding film 401 and the second light shielding film 406 are electrically connected to each other through a contact hole 417 formed in an interlayer insulating film. With this structure, light emitted from the monitor element does not leak to the substrate 400 side and can be sufficiently shielded.

Each of the first light shielding film 401 and the second light shielding film 406 is formed using the same material and in the same step as a wiring which is used for forming the TFT 412 for driving the monitor element. Therefore, the light shielding film can be formed without increasing extra cost and the number of steps.

Here, a light-emitting element is described with reference to FIG. 8, which has a bottom emission structure (or is a bottom emission type), which is provided in a pixel portion and formed over the same substrate as the monitor element portion.

RIG 8 shows a cross-sectional view of a bottom emission type light-emitting element. As a material for a first electrode 1302 serving as an anode, a material having a high work function is desirably used. For example, a light-transmitting conductive film such as an ITO (indium tin oxide) film or an indium zinc oxide (IZO) film can be used. An anode capable of transmitting light can be formed by using a light-transmitting conductive film as the first electrode 1302. Note that the first electrode 1302 is connected to a TFT 1301.

As a material used for a second electrode 1304 serving as a cathode, a metal film formed of a material having a low work function (Al, Ag, Li, or Ca, or an alloy of these materials such as MgAg, MgIn, AlLi, calcium fluoride, calcium nitride, or the like) can be used. A cathode which does not transmit light can be formed by using a metal film which reflects light. In FIG. 8, a reference numeral 1303 denotes an electroluminescent layer.

Figure 8:
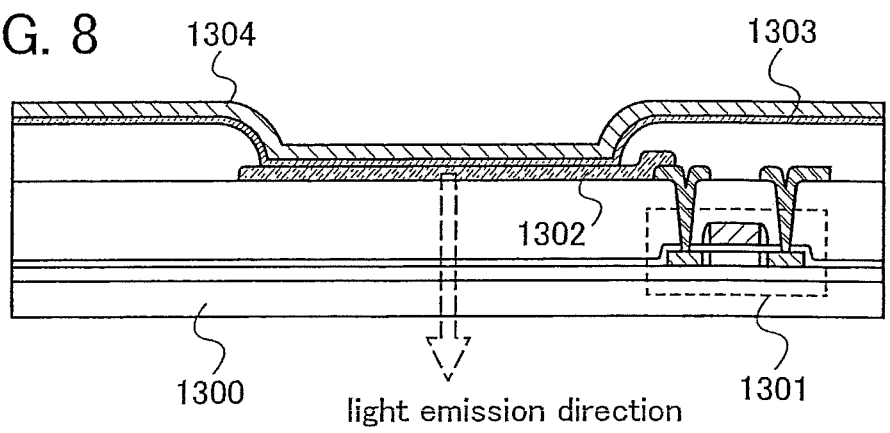
FIG. 8 illustrates a direction of light emission in a display device of the present invention.

Thus, light from the light-emitting element provided in the pixel portion can be taken out downward as shown by an arrow in FIG. 8. When the light-emitting element having the bottom emission structure provided in the pixel portion is used for a display device, a substrate with a light-transmitting property is used as a substrate 1300. In a case of providing an optical film, the optical film may be provided to the substrate 1300.

Embodiment Mode 2

Figure 2B:
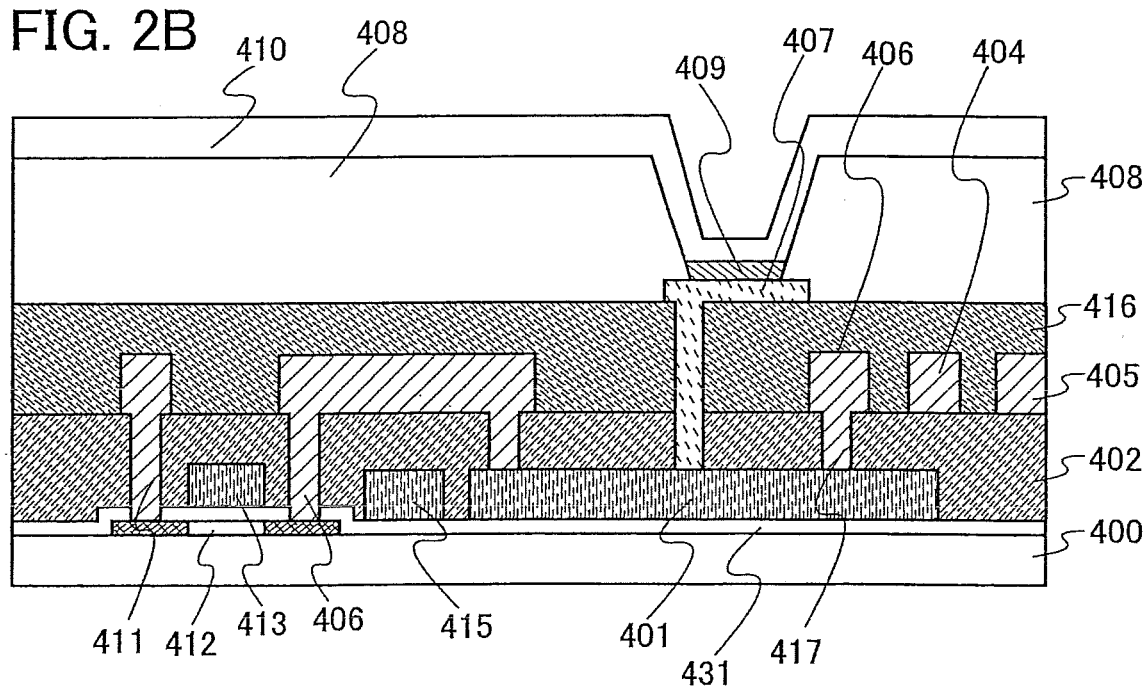

In this embodiment mode, a structure of a display device including a light shielding film is described with reference to FIG. 2B, in which a monitor element portion has two interlayer insulating films. Only an aspect different from Embodiment Mode 1 is described in this embodiment mode.

In Embodiment Mode 1, only one interlayer insulating film is formed as shown in FIG. 2A. Therefore, each of the first electrode 407 and the second light shielding film 406 is connected to the first light shielding film 401 through a contact hole formed in the first interlayer insulating film 402. On the other hand, two interlayer insulating films are formed in this embodiment mode, and the second light shielding film 406 is connected to the first light shielding film 401 through a contact hole 417 formed in the first interlayer insulating film 402, whereas the first electrode 407 is connected to the first light shielding film 401 through a contact hole formed in the first interlayer insulating film 402 and a second interlayer insulating film 416. In FIG. 2B, an example where the second light shielding film 406 has an annular shape is shown, but the present invention is not limited thereto. It is accepted as long as the first light shielding film 401 and the second light shielding film 406 are connected to each other through a contact hole 417 formed to surround the outer edge of the first electrode 407 so that the light emitted from the monitor element is not leaked from the substrate 400 side.

Figure 3B:
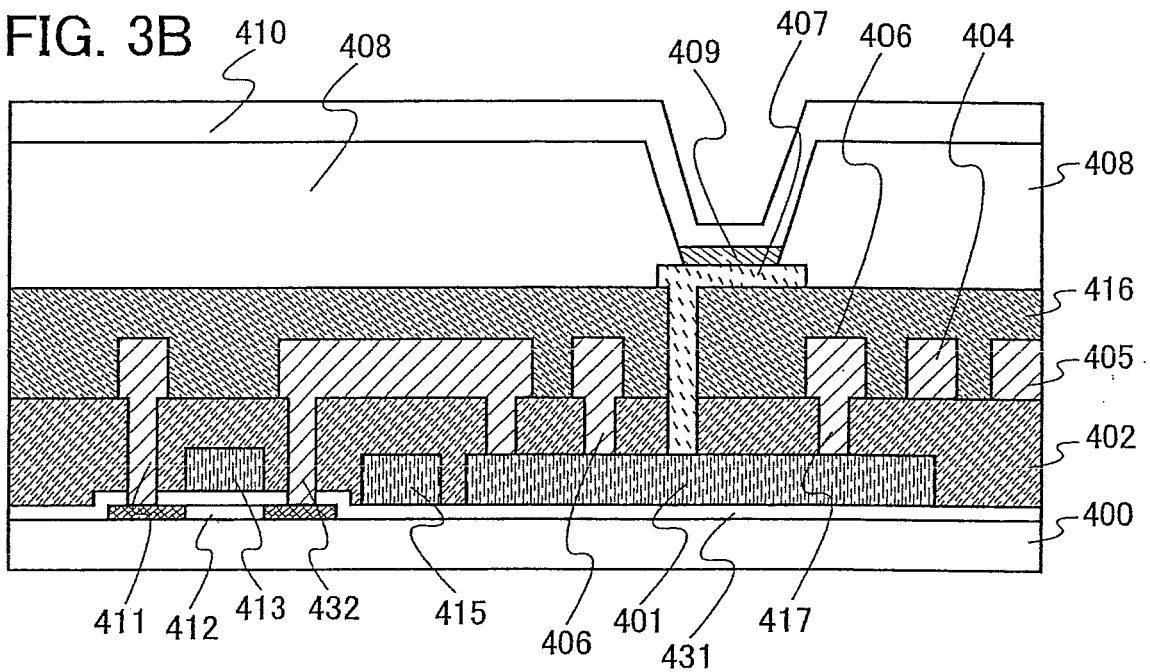

In this embodiment mode, the second light shielding film 406 also serves as the drain electrode (or the source electrode) connected to the TFT 412 for driving the monitor element, but the present invention is not limited to this structure. That is, a structure shown in FIG. 3B may be employed, in which the first light shielding film 401 and the drain electrode (or the source electrode) 432 connected to the TFT 412 are formed as different films and the drain electrode (or the source electrode) 432 is electrically connected to the second light shielding film 406 through the first light shielding film 401. The second light shielding film 406 has an annular shape similarly to that in FIG. 2B and is provided so as to surround the outer edge of the first electrode 407. In addition, the drain electrode (or the source electrode) 432 and the second light shielding film 406 may be formed using the same material and in the same step.

Embodiment Mode 3

In this embodiment mode, a manufacturing process of a monitor element portion in a display device is described. A thin film transistor and a light-emitting element provided in a pixel portion in the display device may be formed under the same manufacturing condition and through the same manufacturing process as a thin film transistor and a monitor element provided in the monitor element portion; therefore, description of the manufacturing process of the pixel portion is omitted here.

Figure 4A:
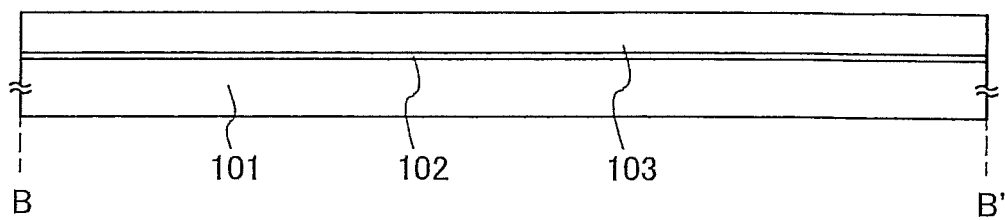
FIGS. 4A to 4D show cross-sectional views illustrating manufacturing steps of a monitor element of the present invention.
Figure 5A:
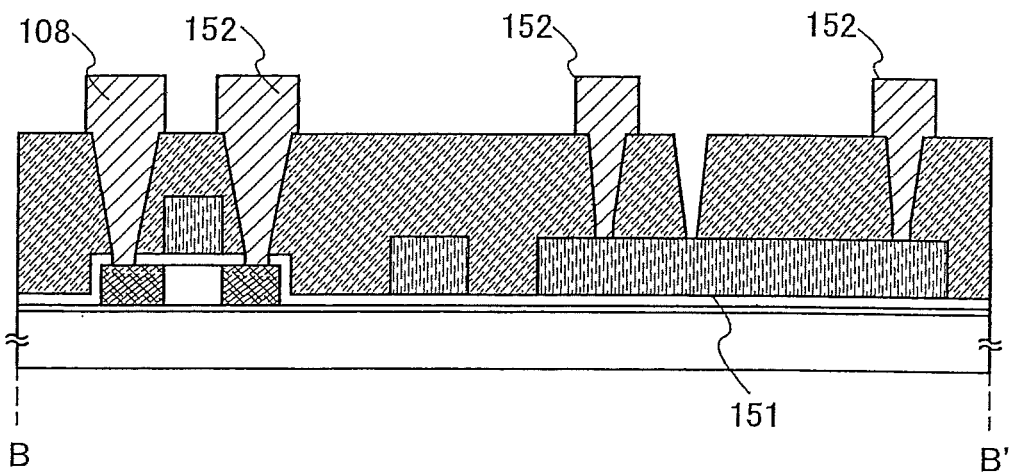
FIGS. 5A to 5C show cross-sectional views illustrating manufacturing steps of a monitor element of the present invention.
Figure 5B:
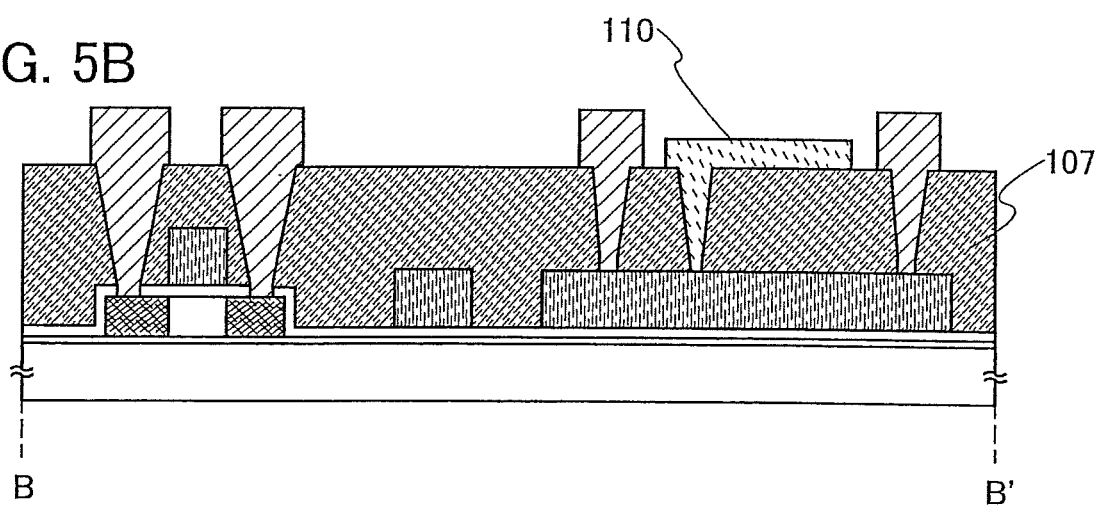
Figure 5C:
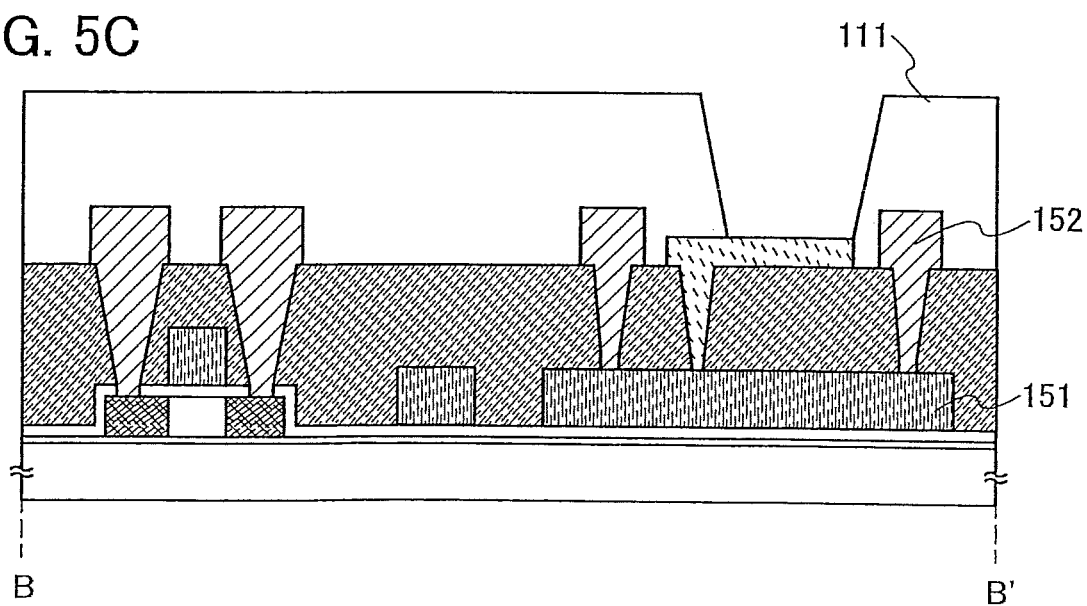
Figure 6:
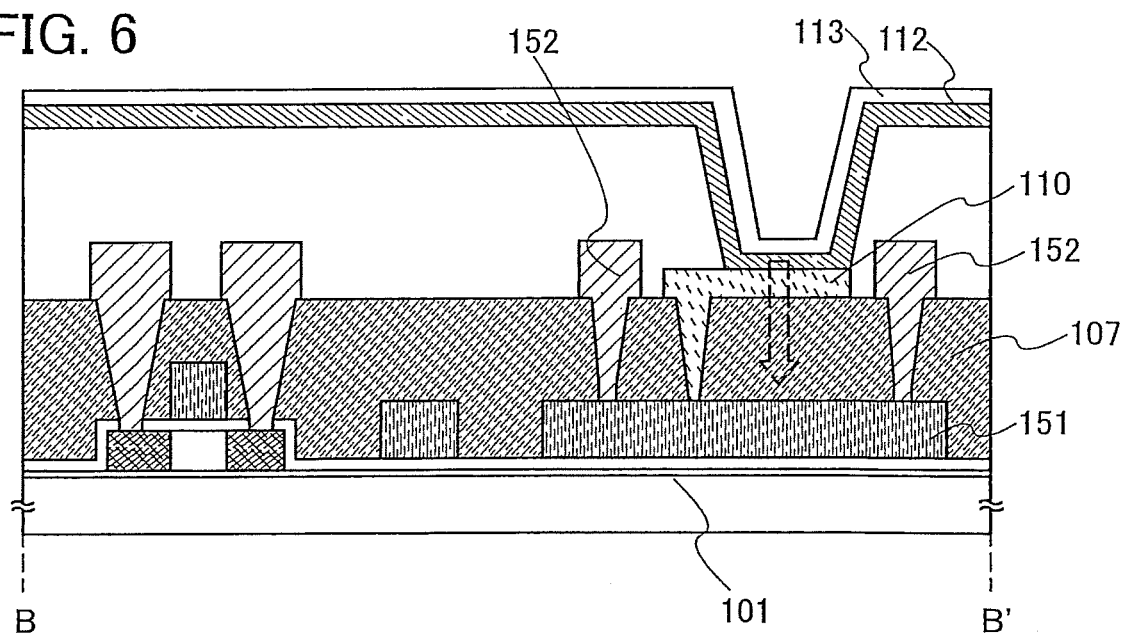
FIG. 6 shows a cross-sectional view illustrating a manufacturing step of a monitor element of the present invention.
Figure 7:
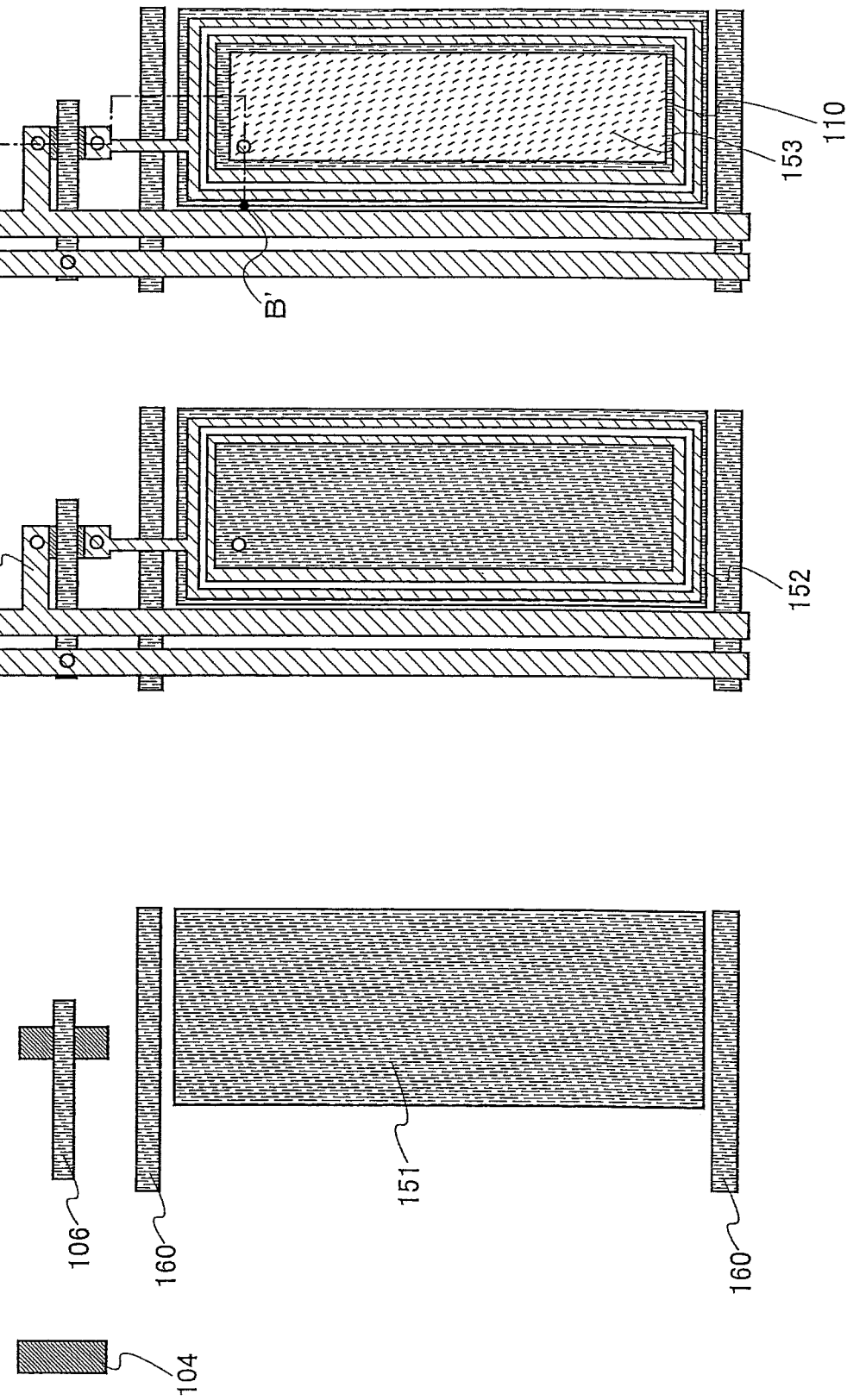
FIGS. 7A to 7D show top views illustrating manufacturing steps of a monitor element of the present invention.

FIGS. 4A to 4D, 5A to 5C, and 6 are cross-sectional views taken along a chained line B-B' in FIG. 7D which shows a top view of the monitor element portion. In FIGS. 7A to 7D, an electroluminescent layer 112 is omitted. First, as shown in FIG. 4A, a base film 102 is formed over an insulating substrate 101. A glass substrate such as barium borosilicate glass or alumino borosilicate glass, a quartz substrate, a ceramic substrate, or the like can be used for the insulating substrate 101. In general, a substrate formed of a synthetic resin with flexibility such as plastic tends to have a lower heat-resistance temperature than the foregoing substrates; however, such a substrate can be used as long as it can withstand a processing temperature in the manufacturing process. That is, a plastic substrate with heat resistance can be used. The surface of the insulating substrate 101 may be polished by CMP or the like to be planarized. Note that the base film 102 is not necessarily formed if there is no fear of contamination from the insulating substrate 101 such as in the case of using a quartz substrate.

The base film 102 may be formed by a method such as CVD typified by plasma CVD or low pressure CVD, or sputtering. The base film may have a single-layer structure including any one of a silicon oxide film, a silicon nitride film, a silicon oxynitride film, or a silicon nitride oxide film, or may have a stacked-layer structure including the foregoing films appropriately. In this specification, silicon oxynitride refers to a compound of silicon, nitrogen and oxygen having a higher composition ratio of oxygen than that of nitrogen, and can also be referred to as silicon oxide containing nitrogen. In this specification, silicon nitride oxide refers to a substance having a higher composition ratio of nitrogen than that of oxygen, and can also be referred to as silicon nitride containing oxygen. In this embodiment mode, the base film has a structure in which a silicon nitride oxide film and a silicon oxynitride film are sequentially stacked.

Subsequently, a semiconductor film 103 is formed over the base film 102. An amorphous semiconductor film may be formed as the semiconductor film 103. Alternatively, a microcrystalline semiconductor film or a crystalline semiconductor film may be formed. Materials of the semiconductor film are not limited; however, silicon or silicon germanium is preferably used. In this embodiment mode, an amorphous silicon film is formed. Note that a step of removing hydrogen contained in the semiconductor film may be performed after the formation of the semiconductor film.

If the base film 102 and the semiconductor film 103 are formed in such a manner that an interface between the base film 102 and the semiconductor film 103 is not exposed to the air during their formation, contamination of the interface can be prevented and variations in characteristics of TFTs to be manufactured can be reduced. In this embodiment mode, the base film 102 and the semiconductor film 103 are continuously formed by plasma CVD without being exposed to the air.

Next, the semiconductor film 103 is crystallized to form a crystalline semiconductor film by laser crystallization, thermal crystallization, thermal crystallization using an element such as nickel which promotes crystallization, or the like. Here, after the crystallization, the entire surface of the crystalline semiconductor film may be doped with an impurity such as boron (B) which imparts p-type conductivity to perform channel doping on a region to serve as a channel formation region in the TFT, so that a threshold voltage of the TFT is controlled. In this embodiment mode, the crystalline semiconductor film formed by crystallizing the semiconductor film 103 is used; however, an amorphous semiconductor film may alternatively be used.

Figure 4B:
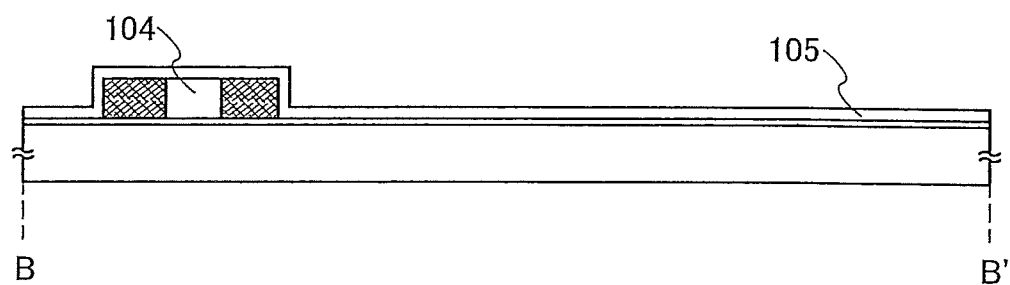

As shown in FIG. 4B, the crystalline semiconductor film is selectively etched to form a crystalline semiconductor layer 104 (island semiconductor layer). FIG. 7A shows a top view of the crystalline semiconductor layer 104.

Then, a gate insulating film 105 is formed over the crystalline semiconductor layer 104. The gate insulating film 105 may have a single-layer structure including any one of a silicon oxide film, a silicon nitride film, a silicon oxynitride film, and a silicon nitride oxide film, or may have a stacked-layer structure including the foregoing films appropriately.

Figure 4C:
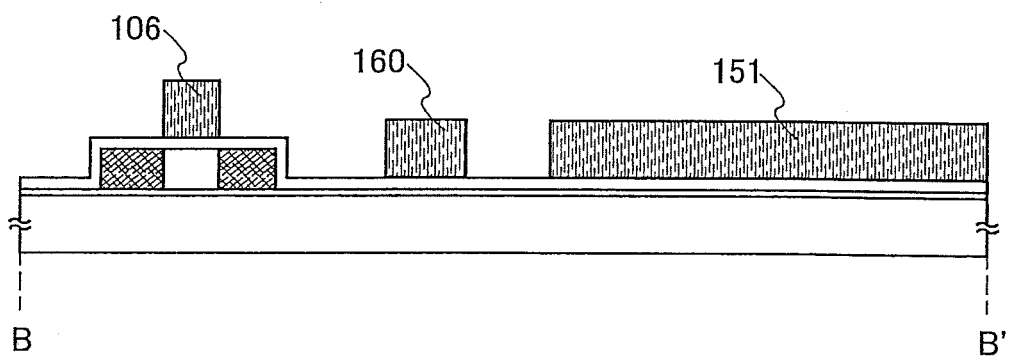

Then, as shown in FIGS. 4C and 7B, a gate line (a gate electrode) 106 of the TFT for driving the monitor element and a gate line 160 connected to a gate driver are formed at the same time as forming a first light shielding film 151 over the gate insulating film 105. The first light shielding film 151 is formed so as to overlap a first electrode 110 to be formed in a later step. The first light shielding film 151 is provided for the monitor element portion, not for the light-emitting element in the pixel portion. As a material for the gate lines 106 and 160 and the first light shielding film 151, a material which contains at least one or plural kinds selected from aluminum, molybdenum, titanium, or carbon, may be used. Here, a composition ratio of molybdenum or titanium is preferably 7.0 to 20 atomic %.

Subsequently, the crystalline semiconductor film 104 is doped with an impurity such as boron (B) which imparts p-type conductivity, using the gate line 106 as a mask. In this step, a source region and a drain region of the TFT can be formed in a self-aligned manner. Note that low concentration impurity regions (LDD region) may be formed by doping or the like between the channel formation region and the source region and between the channel formation region and the drain region of the TFT.

After the doping, a heat treatment, intense light irradiation, or laser light irradiation may be performed to activate the impurity element added to the impurity region. This can activate the impurity element and repair plasma damage of the gate insulating film 105 and of the interface between the gate insulating film 105 and the crystalline semiconductor layer 104.

Figure 4D:
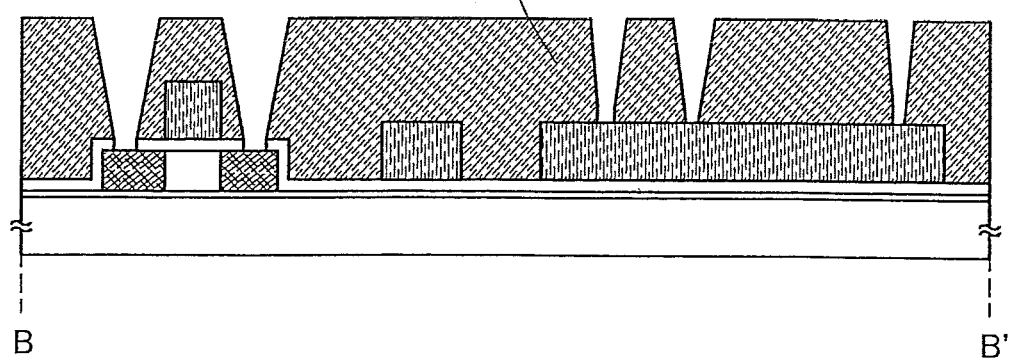

Next, a first interlayer insulating film 107 is formed over the gate insulating film 105 and the gate lines 106 and 160 as shown in FIG. 4D. In this embodiment mode, a silicon nitride oxide film and a silicon oxynitride film are sequentially stacked.

After the formation of the first interlayer insulating film 107, it is preferable to perform a step of hydrogenating the crystalline semiconductor layer (semiconductor layer) 104 by a heat treatment at 300 to 550° C. (more preferably, 400 to 500° C.) for 1 to 12 hours in a nitrogen atmosphere. In this step, dangling bonds in the semiconductor layer can be terminated by hydrogen contained in the first interlayer insulating film 107. In this embodiment mode, the heat treatment is performed at 410° C. for one hour.

Then, contact holes are formed in the first interlayer insulating film 107 so as to reach the source region and the drain region of the TFT and the first light shielding film 151, as shown in FIG. 4D. The contact hole may have a tapered shape.

As shown in FIGS. 5A and 7C, a wiring (a current supply line) 108 and a second light shielding film 152 are formed at the same time to cover the contact holes. The wiring 108 serves as a source line (or a current supply line) and the second light shielding film 152 serves not only as a film for shielding light, but also as a drain electrode. As shown in a top view of FIG. 7C, the second light shielding film 152 is provided so as to overlap the first light shielding film 151 when seen from above, and has an annular shape. The second light shielding film 152 is provided for the monitor element, not for the light-emitting element in the pixel portion.

As a material for the wiring 108 and the second light shielding film 152, metal such as Ag, Au, Cu, Ni, Pt, Pd, Ir, Rh, W, Al, Ta, Mo, Cd, Zn, Fe, Ti, Zr, or Ba, an alloy thereof, metal nitride thereof, or a semiconductor material such as Si or Ge is used. In addition, the wiring 108 and the second light shielding film 152 may have a stacked-layer structure including the foregoing materials. In this embodiment mode, a titanium (Ti) film with a thickness of 100 nm, an alloy film of aluminum and silicon (Al—Si) with a thickness of 700 nm, and a titanium (Ti) film with a thickness of 200 nm are formed and etched into a desired shape.

As shown in FIGS. 5B and 7D, the first electrode 110 is formed in the contact hole formed in the first interlayer insulating film 107. As shown in a top view of FIG. 7D, the first electrode 110 is provided so that it overlaps with the first light shielding film 151 and so that the outer edge of the first electrode 110 is surrounded by the second light shielding film 152 when seen from above.

In this embodiment mode, the first electrode 110 is formed using a light-transmitting film so that light emission from the light-emitting element in the pixel portion is taken out from the first electrode 110 side. Indium tin oxide containing silicon oxide (hereinafter referred to as "ITSO"), zinc oxide, tin oxide, indium oxide, or the like can be used for the first electrode 110. Alternatively, a transparent conductive film such as an indium oxide-zinc oxide alloy, which is indium oxide containing zinc oxide (ZnO) at 2 to 20 atomic %, can be used. As well as the foregoing transparent conductive film, a titanium nitride film or a titanium film may be used. In this case, after forming the transparent conductive film, a titanium nitride film or a titanium film is formed to have a thickness through which light can be transmitted (preferably, approximately 5 to 30 nm). In this embodiment mode, an ITSO film is formed as the first electrode 110 to have a thickness of 110 nm.

The first electrode 110 may be wiped and polished with a polyvinyl alcohol-based porous body or by CMP so that the surface thereof is planarized. Furthermore, ultraviolet irradiation, an oxygen plasma treatment, or the like may be performed on the surface of the first electrode 110 after polishing the surface by CMP.

In this embodiment mode, the process of manufacturing a p-channel TFT is described. However, the present invention can also be applied to the case where an n-channel TFT is manufactured by doping the crystalline semiconductor film 104 with an impurity which imparts n-type conductivity using the gate line as a mask. In addition, the present invention can also be applied to the case where a p-channel TFT and an n-channel TFT are manufactured over one substrate.

The TFT may have a single gate structure with one channel formation region in the crystalline semiconductor layer 104, a double gate structure with two channel formation regions in the crystalline semiconductor layer 104, or a triple gate structure with three channel formation regions in the crystalline semiconductor layer 104. A thin film transistor in a peripheral driver circuit region may also have a single gate structure, a double gate structure, or a triple gate structure.

The present invention is not limited to the method for manufacturing the TFT described in this embodiment mode. The present invention can be applied to the TFT having a top gate type (planar type), a bottom gate type (inversely staggered type), a dual gate type having two gate electrodes located above and below a channel formation region each with a gate insulating film interposed therebetween, or another structure.

Next, as shown in FIG. 5C, an insulating film 111 (referred to as a bank, a partition, a barrier, a mound, or the like) is formed to cover the outer edge of the first electrode 110 and the TFT.

The insulating film 111 can be formed of an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular compound such as polyimide, aromatic polyamide, or polybenzimidazole; an inorganic siloxane-based insulating material including a Si—O—Si bond among compounds that contain silicon, oxygen, and hydrogen and are formed by using a siloxane-based material as a starting material; or an organic siloxane-based insulating material in which hydrogen bonded with silicon is substituted by an organic group such as a methyl group or a phenyl group. Alternatively, the insulating film 111 may be formed using a photosensitive or non-photosensitive material such as acrylic or polyimide. In this embodiment mode, the insulating film 111 is formed using photosensitive polyimide to be plane and have a thickness of 1.5 µm.

The insulating film 111 preferably has such a shape in which a curvature radius of the surface thereof continuously changes, so that the coverage of an electroluminescent layer (a layer containing an organic compound) and a second electrode to be formed over the insulating film 111 can be improved.

A heat treatment is preferably performed before forming the electroluminescent layer in order to further improve reliability. It is preferable that moisture contained in or attached to the first electrode 110 or the insulating film 111 be released by the heat treatment.

Subsequently, as shown in FIG. 6, an electroluminescent layer 112 is formed over the first electrode 110. Although only one monitor element is shown in FIG. 6, electroluminescent layers corresponding to colors of red (R), green (G), and blue (B) are separately formed in this embodiment mode. In this embodiment mode, the electroluminescent layer 112 is selectively formed using a material which emits light of red (R), green (G), or blue (B) by evaporation using an evaporation mask. Each material which emits light of red (R), green (G), or blue (B) can be selectively formed by evaporation using an evaporation mask or by droplet discharging. The droplet discharging method has an advantage in that RGB can be separately located without using a mask. In this embodiment mode, each material which emits light of red (R), green (G), or blue (B) is formed by evaporation.

An organic light-emitting material or an inorganic light-emitting material can be used for the electroluminescent layer. The organic light-emitting material includes a low molecular (monomer) or high molecular (polymer) material; however, either one can be used. The electroluminescent layer may have a single-layer structure or a stacked-layer structure in which any of a hole injection layer, a hole transporting layer, a light-emitting layer, an electron transporting layer, an electron injection layer, and the like are freely combined.

Note that, before the evaporation of the electroluminescent layer, a heat treatment is preferably performed to remove moisture or the like in an atmosphere containing an inert gas as its main component and having an oxygen concentration of 5% or less and a water concentration of 1% or less. In this embodiment mode, the heat treatment is performed at 300° C. for one hour.

Then, a second electrode 113 is formed of a conductive film over the electroluminescent layer 112. When the first electrode 110 serves as an anode, the second electrode 113 serves as a cathode; when the first electrode 110 serves as a cathode, the second electrode 113 serves as an anode. A material having a low work function (Al, Ag, Li, Ca, or an alloy thereof, that is, MgAg, MgIn, AlLi, CaF$_2$, or calcium nitride) may be used for the second electrode 113.

According to the foregoing steps, the monitor element including the first electrode 110, the electroluminescent layer 112, and the second electrode 113 is formed. The region of the monitor element which emits light is shown as a light-emitting region 153 in FIG. 7D. The light-emitting region 153 is shielded by the first light shielding film 151 and the second light shielding film 152 so that light does not leak from the substrate 101 side.

In the display device shown in FIG. 6, light generated in the monitor element is transmitted through the first interlayer insulating film 107 formed between the substrate 101 and the first electrode 110 and is emitted in a direction shown by an arrow through the first electrode 110, but is blocked by the first light shielding film 151 and the second light shielding film 152.

It is advantageous to provide a passivation film so as to cover the second electrode 113. The passivation film can have a single-layer structure including an insulating film containing silicon nitride, silicon oxide, silicon oxynitride, silicon nitride oxide, aluminum nitride, aluminum oxynitride (AlON) containing more oxygen than nitrogen, aluminum nitride oxide (AlNO) containing more nitrogen than oxygen, aluminum oxide, diamond like carbon (DLC), or a nitrogen-containing carbon film (CN); or a stacked-layer structure in which the foregoing films are combined. In addition, a material which has a skeleton structure formed by the bond of silicon (Si) and oxygen (O) and has at least hydrogen in a substituent, or has at least one of fluorine, an alkyl group, or aromatic hydrocarbon in a substituent may be used.

In this case, a film with favorable coverage is preferably used as the passivation film, and it is preferable to use a carbon film, particularly, a DLC film. Since the DLC film can be formed at a temperature ranging from room temperature to 100° C., it can be easily formed over the electroluminescent layer 112 having low heat resistance. The DLC film has a high blocking effect against oxygen and can suppress oxidation of the electroluminescent layer 112. Therefore, a problem such as oxidization of the electroluminescent layer 112 during the following sealing step can be prevented.

Subsequently, the substrate 101 provided with the light-emitting element and the monitor element is fixed to a sealing substrate with a sealant, whereby the light-emitting element and the monitor element are sealed. Since the moisture entering from a cross section can be blocked by the sealant, the light-emitting element can be prevented from deteriorating and reliability of the display device is improved. Note that a region surrounded by the sealant may be filled with a filler or with nitrogen or the like by performing the sealing in a nitrogen atmosphere. The filler can fill the display device by being dropped in a liquid state. Since the light-emitting element in this embodiment mode is a bottom emission type, the filler does not necessarily have a light-transmitting property. If a structure in which light is taken out through the filler is employed, the filler needs to be formed using a material with a light-transmitting property. A visible-light curing, ultraviolet curing, or thermosetting epoxy resin can be given as an example of the filler. According to the foregoing steps, the display device having the light-emitting element is completed.

As the sealant, an ultraviolet curing resin, a thermosetting resin, a silicone resin, an epoxy resin, an acrylic resin, a polyimide resin, a phenol resin, a PVC (polyvinyl chloride), PVB (polyvinyl butyral), or EVA (ethylene vinyl acetate) can alternatively be used. In addition, a filler (spacer in a form of a stick or a fiber) or a spherical spacer may be added to the sealant.

In order to prevent the element from deteriorating due to moisture, a drying agent is preferably provided in a display panel. In this embodiment mode, the drying agent is provided in a depression formed in the sealing substrate to surround the pixel region and the monitor element portion, so as not to interfere with thinning the display device. In addition, a water absorption area can be enlarged by providing the drying agent in a region corresponding to a gate line layer; which leads to a higher water absorption effect. Since the drying agent is formed over the gate line layer, which itself does not emit light, the light extraction efficiency in the pixel portion is not decreased.

In this embodiment mode, the case of sealing the light-emitting element by using a glass substrate as a cover material is described. Sealing is a process for protecting the light-emitting element from moisture, and is performed employing any of the following methods: a method in which the light-emitting element is mechanically sealed with a cover material; a method in which the light-emitting element is sealed with a thermosetting resin or an ultraviolet curing resin; and a method in which the light-emitting element is sealed with a thin film having a high bather property such as metal oxide, metal nitride, or the like. The cover material can be glass, ceramic, plastic, or metal, but when light is emitted to the cover material side, the cover material needs to have a light-transmitting property. The cover material is attached to the substrate which is provided with the light-emitting element by a sealant such as a thermosetting resin or an ultraviolet curing resin, and the resin is cured by a heat treatment or an ultraviolet irradiation treatment, thereby forming an enclosed space. It is also advantageous to provide a moisture absorbent typified by barium oxide in this enclosed space. The moisture absorbent may be provided on the sealant to be in contact therewith, or over the partition or the periphery thereof so as not to interfere with light from the light-emitting element. Further, a space between the cover material and the substrate provided with the light-emitting element can be filled with a thermosetting resin or an ultraviolet curing resin. In this case, it is advantageous to add a moisture absorbent typified by barium oxide to the thermosetting resin or the ultraviolet curing resin.

A glass substrate or a plastic substrate is used for a cover material. The plastic substrate may be polyimide, polyamide, an acrylic resin, an epoxy resin, PES (polyether sulfone), PC (polycarbonate), PET (polyethylene terephthalate), or PEN (polyethylene naphthalate) in the form of a plate or a film.

The enclosed space is filled with a dried inert gas. A slight amount of moisture in the enclosed space surrounded by the sealant is removed by a drying agent, and is sufficiently dried. The drying agent may be a substance which absorbs moisture by chemical adsorption such as an oxide of an alkaline earth metal as typified by calcium oxide or barium oxide. A substance which adsorbs moisture by physical adsorption such as zeolite or silica gel may alternatively be used.

If necessary, a polarizing plate or a circularly polarizing plate (including an elliptically polarizing plate), a retardation film (quarter-wave plate or half-wave plate), or an optical film such as a color filter may be appropriately provided for a surface from which light from a light-emitting element is emitted. Further, a polarizing plate or a circularly polarizing plate may be provided with an anti-reflective film. For example, an anti-glare treatment which can diffuse reflected light with a depression and a projection on the surface, and reduce glare can be performed. Alternatively, an anti-reflection treatment may be performed on the polarizing plate or the circularly polarizing plate by a heat treatment. Thereafter, a hard coat treatment is preferably performed for protection from external shock.

Embodiment Mode 4

Figure 9:
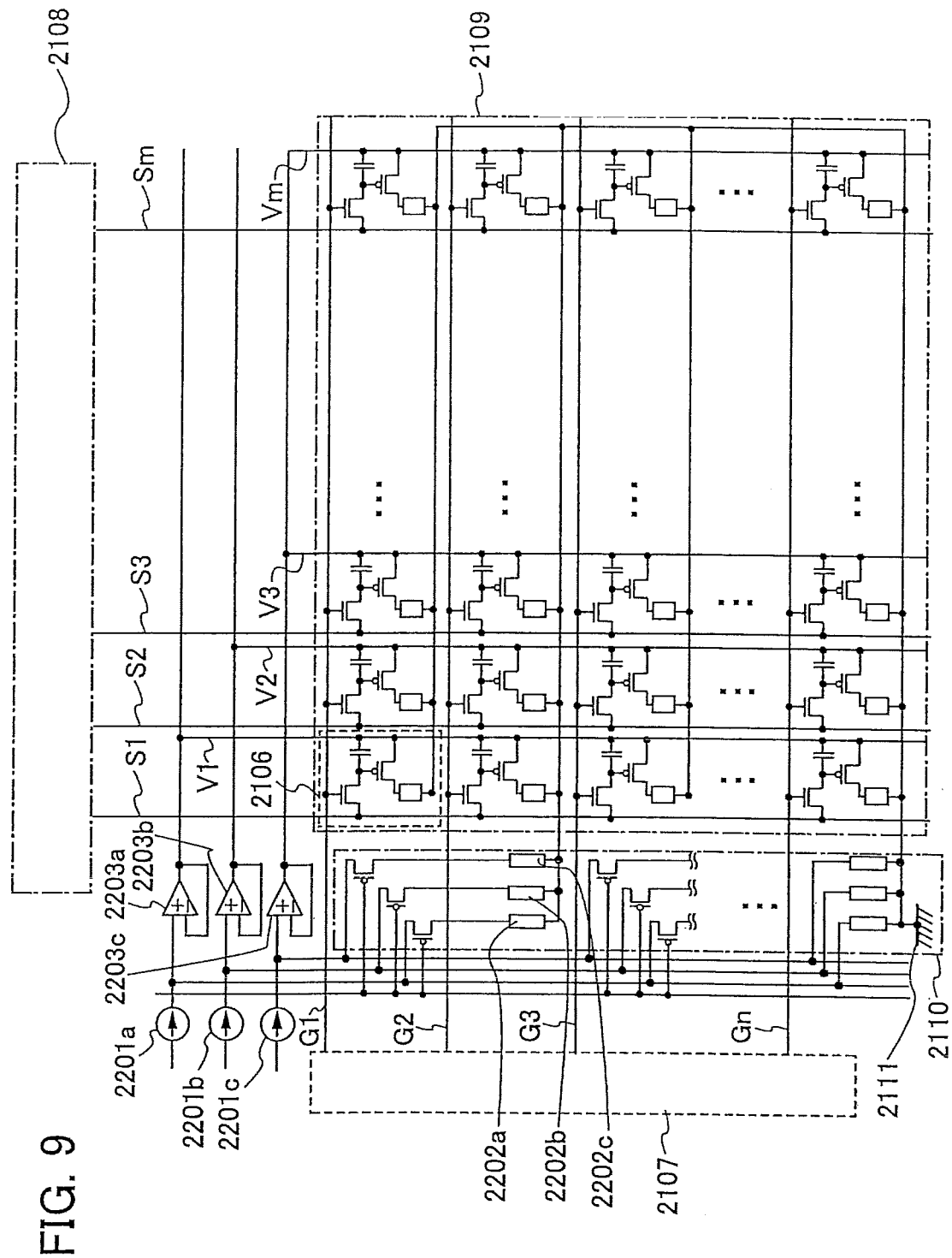
FIG. 9 shows a relationship between a pixel portion and a monitor element portion of a display device of the present invention.

In this embodiment mode, a structure of a display device having a light-emitting element provided in a pixel portion and a monitor element provided in a monitor element portion is described with reference to FIG. 9. The display device of this embodiment mode includes a gate driver 2107, a source driver 2108, and a pixel portion 2109. In addition, a monitor element portion 2110 provided close to a side of the pixel portion 2109 is also included. In the monitor element portion 2110, three columns of monitor elements corresponding to RGB are provided. Further, in each column of the memory elements corresponding to RGB, monitor elements and TFTs for driving the monitor elements are arranged alternately. In other words, the monitor elements corresponding to RGB and the TFTs for driving the monitor elements corresponding to RGB are provided so as not to overlap each other and each of the numbers thereof is half the number of the matrix-arranged light-emitting elements in one column in the pixel portion. Either an n-channel type TFT or a p-channel type TFT may be used for the TFT for driving the monitor element. In this embodiment mode, a p-channel type TFT is used.

In the display device of this embodiment mode, the monitor element provided in the monitor element portion 2110 and the light-emitting element provided in the pixel portion are formed over one substrate and are formed under the same manufacturing condition and in the same step. Therefore, the light-emitting element and the monitor element can have almost the same characteristics if the change in ambient temperature and change over time are generated. In addition, since the aperture ratio of the light-emitting element is comparable with that of the monitor element portion, they have the same deterioration properties.

A constant current source 2201a is connected to one electrode (anode) of a monitor element 2202a and a non-inverting input terminal of a voltage follower circuit 2203a. The other electrode (cathode) of the monitor element 2202a is connected to the ground potential 2111. Furthermore, an output terminal of the voltage follower circuit 2203a is connected to one electrode of the light-emitting element through a 111 for driving the light-emitting element provided in a pixel 2106 in the pixel portion 2109. In this embodiment mode, a voltage follower circuit is used as an amplifier circuit, but the present invention is not limited thereto. An adder circuit may be provided between an output terminal of the voltage follower circuit 2203a, which outputs a constant potential corresponding to the inputted potential, and the TFT for driving the light-emitting element provided in the pixel portion 2109. In other words, the structure in which an input (terminal) of the adder circuit is connected to the output terminal of the voltage follower circuit 2203a and an output of the adder circuit is connected to one of a source electrode and a drain electrode of the TFT for driving the light-emitting element.

A pixel connected to a signal line S1 is to be a pixel emitting R light, a pixel connected to a signal line S2 is to be a pixel emitting G light, and a pixel connected to a signal line S3 is to be a pixel emitting B light. The constant current source 2201a supplies current to the monitor element 2202a and the voltage follower circuit 2203a detects potential of the anode of the monitor element 2202a and sets the potential to a power supply line V1. A constant current source 2201b supplies current to a monitor element 2202b and a voltage follower circuit 2203b detects potential of the anode of the monitor element 2202b, and sets the potential to a power supply line V2. A constant current source 2201c supplies current to a monitor element 2202c and a voltage follower circuit 2203c detects potential of the anode of a monitor element 2202c, and sets the potential to a power supply line V3. According to this structure, potential can be separately set for each color of R, or B. Therefore, even if the temperature characteristics and the degree of the deterioration of EL materials for RGB vary, a desired potential can be separately set to a light-emitting element of each color, and power supply potential can be corrected for each of RGB.

Although one of the electrodes of the monitor element connected to the constant current source is described as an anode in this embodiment mode, it may be a cathode. Moreover, although the voltage of a cathode which is the other one of the electrodes of the monitor element is set as a ground potential in this embodiment mode, it is not limited to this structure.

Embodiment Mode 5

In this embodiment mode, one example of a light-emitting display panel is described with reference to FIGS. 10A and 10B. FIG. 10A is a top view of a panel which is obtained by sealing a space between a first substrate and a second substrate with a first sealant 1205 and a second sealant 1206. FIG. 10B is a cross-sectional view taking along to a chained line C-C' and a chained line D-D' in FIG. 10A.

In FIG. 10A, a reference numeral 1202 denotes a pixel portion, 1230 denotes a monitor element portion, and 1203 denotes a scanning line (a gate line) driver circuit, each of which is indicated by a dotted line. In this embodiment mode, the pixel portion 1202, the scanning line driver circuit 1203, and a connection region 1210 are located in the region sealed with the first sealant and the second sealant. A reference numeral 1201 denotes a signal line (source line) driver circuit which is chip-shaped and is provided over a first substrate 1200. As the first sealant, an epoxy resin having high viscosity including a filler is preferably used. On the other hand, the second sealant is preferably an epoxy resin having low viscosity. In addition, the first sealant 1205 and the second sealant 1206 are desirably materials which transmit as little moisture or oxygen as possible.

In addition, a drying agent may be provided between the pixel portion 1202 and the first sealant 1205. Further, a drying agent may be provided over the scanning line or the signal line in the pixel portion 1202. The drying agent is preferably a substance which adsorbs water ($H_2O$) by chemical adsorption such as oxide of alkaline earth metal such as calcium oxide (CaO) or barium oxide (BaO). However, the present invention is not limited to these, and a substance which adsorbs water by physical adsorption such as zeolite or silica gel may alternatively be used.

A resin having high moisture permeability and including a particulate drying agent may be fixed to the second substrate 1204. As substitute for the resin having high moisture permeability, an inorganic substance such as siloxane polymers, polyimide, phosphosilicate glass (PSG), or borophosphosilicate glass (BPSG) can alternatively be used.

By providing the foregoing drying agent, intrusion of moisture into a light-emitting element and deterioration resulting therefrom can be suppressed without decreasing an aperture ratio. Therefore, variation in deterioration of the light-emitting elements in the periphery portion and the center portion of the pixel portion 1202 can be suppressed.

Note that in FIG. 10A, a reference numeral 1210 denotes a connection wiring region for transmitting a signal inputted to the signal line driver circuit 1201 and the scanning line driver circuit 1203 and receiving a video signal or a clock signal from a flexible printed wiring 1209 (FPC) which serves as an external input terminal through a connection wiring 1208.

Next, a cross-sectional structure is described with reference to FIG. 10B. Over the substrate 1200, a driver circuit and a pixel portion are formed, which include a plurality of semiconductor elements typified by a TFT. FIG. 10B shows the signal line driver circuit 1201 as the driver circuit and the pixel portion 1202. Note that the signal line driver circuit 1201 has a CMOS circuit including both an n-channel TFT 1221 and a p-channel TFT 1222.

Since the scanning line driver circuit and the TFT in the pixel portion are formed over one substrate in this embodiment mode, the volume of the light-emitting display device can be decreased.

The pixel portion 1202 includes a switching TFT 1211 and a plurality of pixels each having a driving TFT 1212 a first pixel electrode (anode) 1213 formed of a light-transmitting conductive film which is electrically connected to a drain electrode or a source electrode of the driving TFT 1212.

In addition, an insulating layer 1214 (also referred to as a bank, partition wall, barrier, mound, or the like) is formed on opposite ends of the first pixel electrode (anode) 1213. In order to enhance the coverage of a film formed over the insulating layer 1214, the insulating layer 1214 is formed to have a curved surface having curvature on the top end or the bottom end. Further, the surface of the insulating layer 1214 may be covered with a protective film formed of an aluminum nitride film, an aluminum nitride oxide film, a thin film mainly including carbon, or a silicon nitride film. In addition, if an organic material in which a material which absorbs visible light such as a black colorant or pigment is dissolved or dispersed is used for the insulating layer 1214, the stray light of a light-emitting element to be formed later can be absorbed. Therefore, contrast of each pixel can be improved.

An electroluminescent layer 1215 is selectively formed over the first pixel electrode (anode) 1213 by evaporating an organic compound material. In addition, a second pixel electrode (cathode) 1216 is formed over the electroluminescent layer 1215.

In this manner, a light-emitting element 1217 including the first pixel electrode (anode) 1213, the electroluminescent layer 1215, and the second pixel electrode (cathode) 1216 is formed. The light-emitting element 1217 emits light to the first substrate 1200 side.

In addition, a protective film 1218 is formed in order to seal the light-emitting element 1217. The protective film has, for example, stacked layers including a first inorganic insulating film, a stress relaxation film, and a second inorganic insulating film. Then, the protective film 1218 is attached to the second substrate 1204 with the first sealant 1205 and the second sealant 1206. Note that the second sealant is preferably dropped using an apparatus for dropping a sealant. After dropping or discharging the sealant from a dispenser and applying the sealant to an active matrix substrate, the second substrate is attached to the active matrix substrate in vacuum and ultraviolet curing is performed; thereby sealing is performed.

An antireflection film 1226 for preventing external light from reflecting off a substrate surface is provided for the surface of the second substrate 1204. Either or both of a polarizing plate and a retardation film may be provided between the second substrate and the antireflection film 1226. By providing a polarizing plate or a retardation plate, external light can be prevented from reflecting off the first pixel electrode 1213. Note that if the first pixel electrode 1213 and the second pixel electrode 1216 are formed using a light-transmitting conductive film or a semi-light-transmitting conductive film (through which about half of emitted light is transmitted), and the insulating layer 1214 is formed of a material which absorbs visible light or an organic material in which a material which absorbs visible light is dissolved or dispersed; each pixel electrode does not reflect external light; therefore, the retardation plate and the polarizing plate are not necessarily provided.

The connection wiring 1208 and the flexible printed wiring 1209 are electrically connected to each other through an anisotropic conductive resin or an anisotropic conductive film 1227. Further, it is preferable that a connecting portion between each wiring layer and a connecting terminal be sealed with a sealing resin. With such a structure, moisture can be prevented from entering the light-emitting element from the cross-sectional portion and deterioration can be prevented.

Note that the space between the second substrate 1204 and the protective film 1218 may be filled with an inert gas such as nitrogen gas, instead of the second sealant 1206, so that the intrusion of moisture and oxygen can be effectively prevented.

In addition, a colored layer may be provided between the second substrate and the polarizing plate. In this case, full color display can be performed by providing light-emitting elements capable of white light emission in the pixel portion and additionally providing colored layers of RGB. Alternatively, full color display can be performed by providing light-emitting elements capable of blue light emission in the pixel portion and additionally providing a color conversion layer or the like. Further alternatively, light-emitting elements which emit red, green, and blue light formed in the pixel portion and the colored layer may be used. Such a display module has high color purity of RGB, and is capable of displaying high-resolution images.

In addition, a light-emitting display module may be formed using a substrate formed of a film, a resin, or the like as one or both of the first substrate 1200 and the second substrate 1204. If sealing is performed without using a counter substrate in such a manner, weight saving, downsizing, and thinning of the display device can be achieved.

Furthermore, the light-emitting display module may be formed by providing an IC chip such as a controller, a memory, and a pixel driver circuit for the surface or at the edge of the flexible printed wiring 1209 to serve as an external input terminal.

This embodiment mode can be combined with any one of Embodiment Modes 1 to 4.

Embodiment Mode 6

A display device of the present invention can be used for display portions of various electronic appliances. In particular, a display device of the present invention is desirably used for mobile devices required to be thin and light weight.

Examples of electronic appliances using the display device described in the foregoing embodiment modes in their housings are given as follows: a television apparatus (simply referred to as TV, television, or television set), a camera (a video camera, a digital camera, or the like), a goggle type display, a navigation system, an audio reproducing device (car audio, an audio component, or the like), a computer, a game machine, a portable information terminal (a mobile computer, a portable phone, a portable game machine, an electronic book, or the like), an image reproducing device provided with a recording medium (specifically, a device which reproduces a recording medium such as a DVD (digital versatile disc), an HD DVD (high definition DVD), or a Blu-ray Disk and which is equipped with a display for displaying the image), and other electronics each having a display portion (such as a front projector or a rear projector). Specific examples of these electronic appliances are shown in FIGS. 11A to 11F.

Figure 11A:
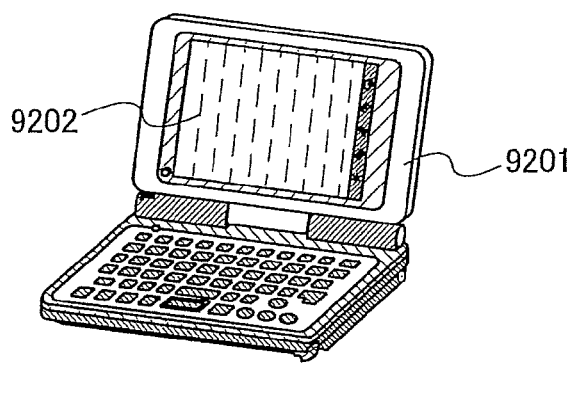
FIGS. 11A to 11F show electronic appliances including a display device of the present invention.

A portable information terminal shown in FIG. 11A includes a body 9201, a display portion 9202, and the like. The display device shown in any of Embodiment Modes 1 to 5 can be applied to the display portion 9202. Using a display device according to an aspect of the present invention, the portable information terminal having high reliability can be provided at low cost.

Figure 11B:
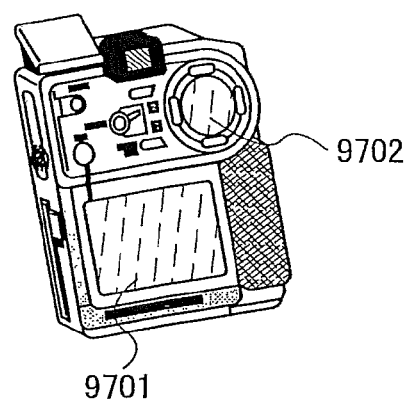

A digital video camera shown in FIG. 11B includes display portions 9701 and 9702, and the like. The display device shown in any of Embodiment Modes 1 to 5 can be applied to the display portion 9701. Using a display device according to an aspect of the present invention, the digital video camera having high reliability can be provided at low cost.

Figure 11C:
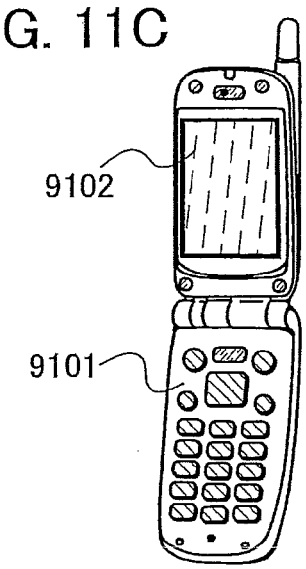

A portable phone shown in FIG. 11C includes a body 9101, a display portion 9102, and the like. The display device shown in any of Embodiment Modes 1 to 5 can be applied to the display portion 9102. Using a display device according to an aspect of the present invention, the portable phone having high reliability can be provided at low cost.

Figure 11D:
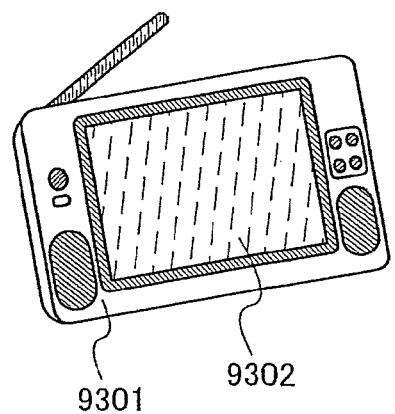

A portable television apparatus shown in FIG. 11D includes a body 9301, a display portion 9302, and the like. The display device shown in any of Embodiment Modes 1 to 5 can be applied to the display portion 9302. Using a display device according to an aspect of the present invention, a portable television apparatus having high reliability can be provided at low cost. Such a television apparatus can be widely applied to a small size television apparatus mounted on a portable terminal such as a portable phone, a medium size one which can be carried, and a large size one (for example, 40 inches or more).

Figure 11E:
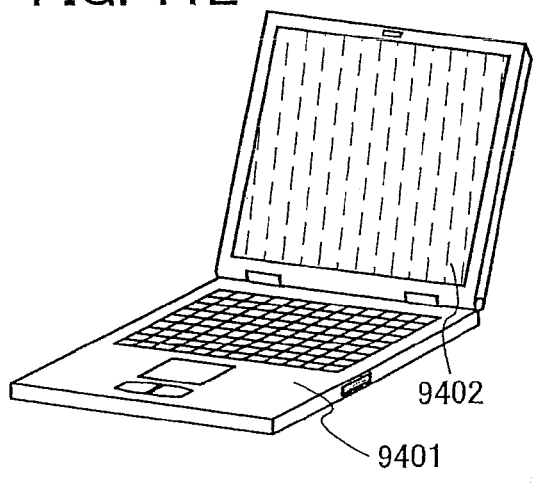

A portable computer shown in FIG. 11E includes a body 9401, a display portion 9402, and the like. The display device shown in any of Embodiment Modes 1 to 5 can be applied to the display portion 9402. Using a display device according to an aspect of the present invention, a portable computer having high reliability can be provided at low cost.

Figure 11F:
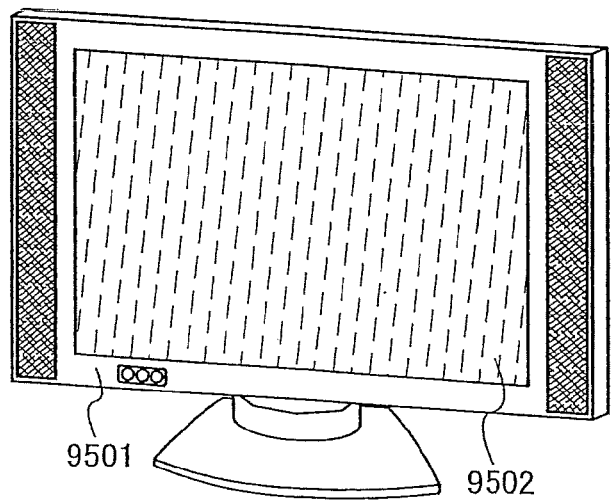
Figure 13A:
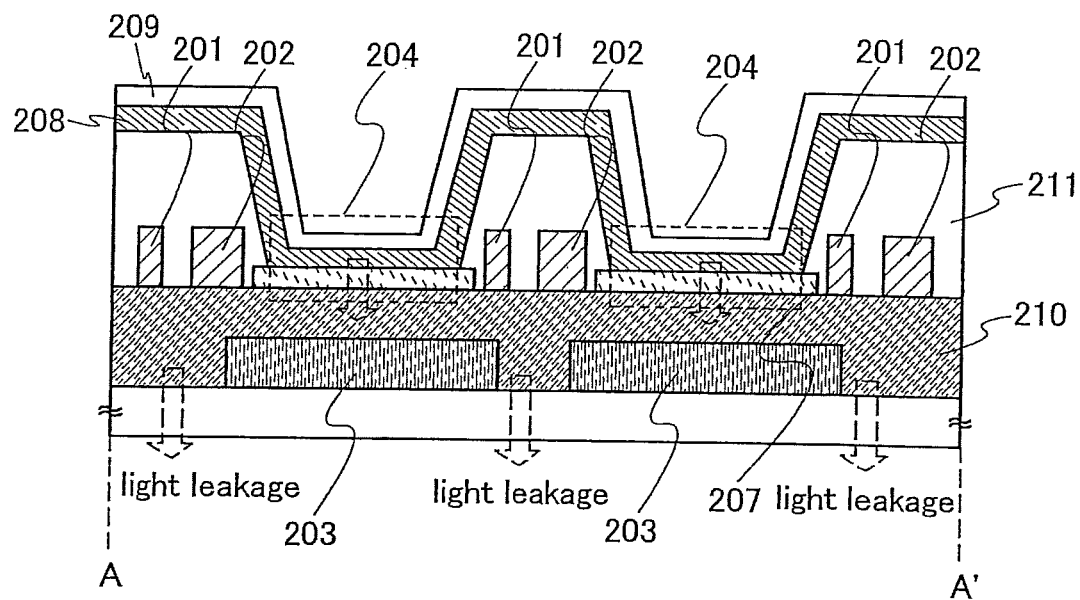
FIGS. 13A and 13B show cross-sectional views of a monitor pixel (comparative example)
Figure 13B:
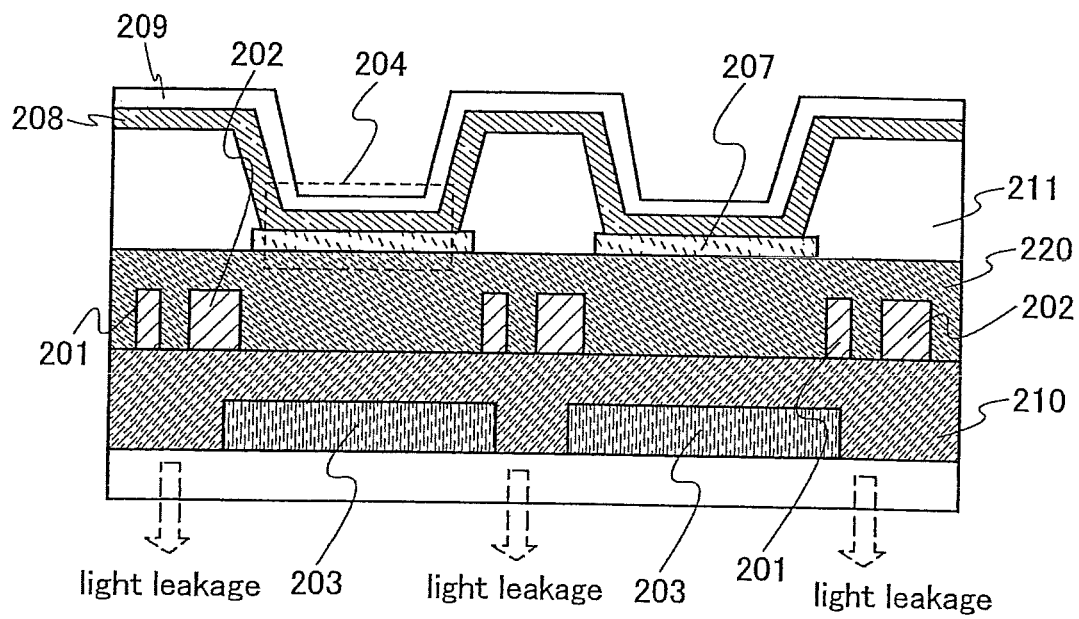
Figure 14:
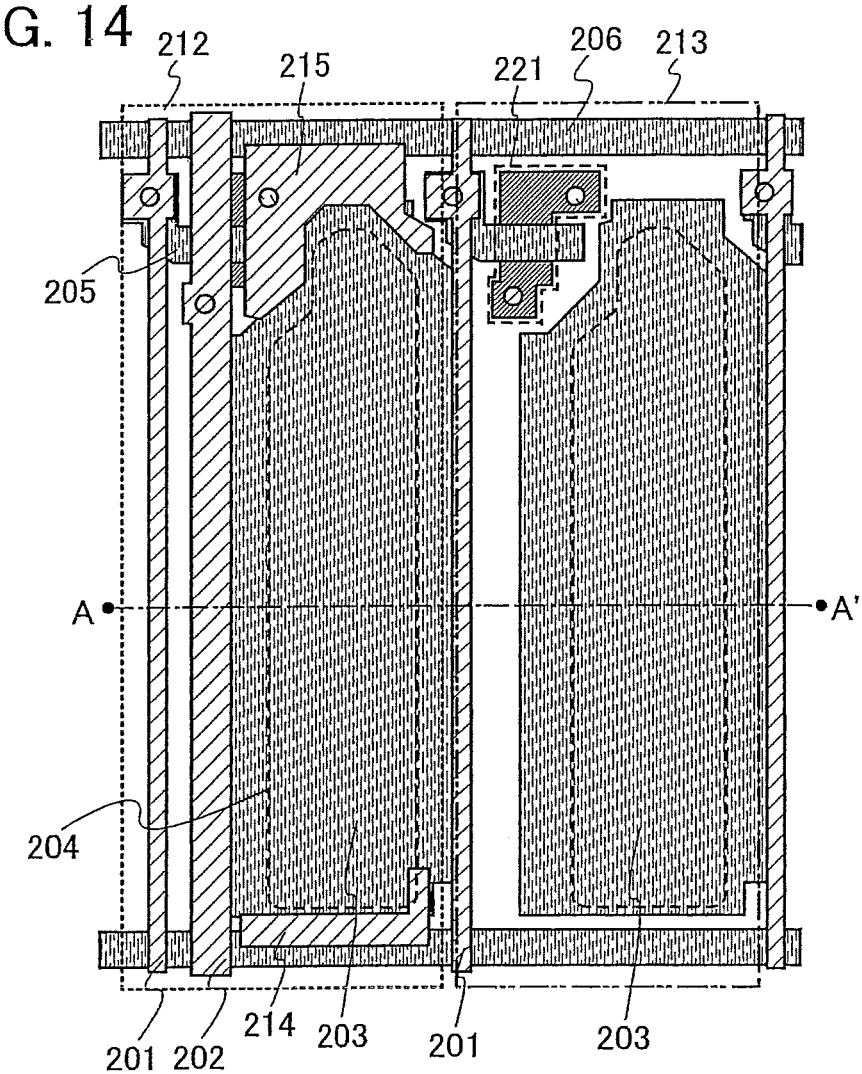
FIG. 14 shows a layout of a monitor pixel (comparative example).

A television apparatus shown in FIG. 11F includes a body 9501, a display portion 9502, and the like. The display device shown in any of Embodiment Modes 1 to 5 can be applied to the display portion 9502. Using a display device according to an aspect of the present invention, a television apparatus having high reliability can be provided at low cost.

As described above, the present invention can be applied widely and used in every field of electronic appliances.

This application is based on Japanese Patent Application serial no. 2006-002841 filed in Japan Patent Office on Jan. 10, in 2006, the entire contents of which are hereby incorporated by reference.

What is claimed is:

1. A display device comprising:
a pixel portion comprising a plurality of pixels;
a driver circuit; and
a region between the pixel portion and the driver circuit, the region comprising:
 a semiconductor layer over a substrate;
 a first electrode over the semiconductor layer with a first insulating film between the semiconductor layer and the first electrode, the first electrode being in contact with the first insulating film;
 a first conductive film in contact with the semiconductor layer;
 a second conductive film over and in contact with the first insulating film, the second conductive film being in contact with the first conductive film;
 a second electrode over the second conductive film, the second electrode overlapping with the second conductive film;
 an electroluminescent layer over the second electrode; and
 a third electrode over the electroluminescent layer.

2. The display device according to claim 1,
wherein the second conductive film is in contact with the first conductive film through at least a contact hole of a second insulating film, and
wherein the second electrode is in contact with the second conductive film through at least a contact hole of a third insulating film.

3. The display device according to claim 1,
wherein the first conductive film is in contact with the semiconductor layer through at least a contact hole of the first insulating film.

4. The display device according to claim 2,
wherein the second insulating film is over the first insulating film.

5. The display device according to claim 2,
wherein the third insulating film is over the second insulating film.

6. The display device according to claim 1,
wherein the electroluminescent layer is in contact with the second electrode.

7. The display device according to claim 6,
wherein the electroluminescent layer is over the second electrode with a fourth insulating film between the electroluminescent layer and the second electrode, and
wherein the electroluminescent layer is in contact with the second electrode through the fourth insulating film.

8. The display device according to claim 1,
wherein the second electrode, the electroluminescent layer and the third electrode form a monitor element.

9. The display device according to claim 1,
wherein the first electrode is a gate electrode of a transistor.

10. The display device according to claim 9,
wherein the transistor has a dual gate structure.

11. The display device according to claim 1,
wherein each of the first conductive film and the second conductive film is a light shielding film.

12. A display device comprising:
a pixel portion comprising a plurality of pixels;
a driver circuit; and
a region between the pixel portion and the driver circuit, the region comprising:
 a semiconductor layer over a substrate;
 a first electrode over the semiconductor layer;
 a first conductive film in contact with the semiconductor layer;
 a second conductive film in contact with the first conductive film, the second conductive film comprising a same material as the first electrode;
 a second electrode in contact with the second conductive film, the second electrode overlapping with the second conductive film;
 an electroluminescent layer over the second electrode; and
 a third electrode over the electroluminescent layer.

13. The display device according to claim 12,
wherein the first conductive film is in contact with the semiconductor layer through at least a contact hole of a first insulating film,
wherein the second conductive film is in contact with the first conductive film through at least a contact hole of a second insulating film, and
wherein the second electrode is in contact with the second conductive film through at least a contact hole of a third insulating film.

14. The display device according to claim 13,
wherein the second insulating film is over the first insulating film.

15. The display device according to claim 13,
wherein the third insulating film is over the second insulating film.
16. The display device according to claim 12,
wherein the electroluminescent layer is in contact with the second electrode.
17. The display device according to claim 16,
wherein the electroluminescent layer is over the second electrode with a fourth insulating film between the electroluminescent layer and the second electrode, and
wherein the electroluminescent layer is in contact with the second electrode through the fourth insulating film.
18. The display device according to claim 12,
wherein the second electrode, the electroluminescent layer and the third electrode form a monitor element.
19. The display device according to claim 12,
wherein the first electrode is a gate electrode of a transistor.
20. The display device according to claim 19,
wherein the transistor has a dual gate structure.
21. The display device according to claim 12,
wherein each of the first conductive film and the second conductive film is a light shielding film.

\* \* \* \* \*

UNITED STATES PATENT AND TRADEMARK OFFICE
CERTIFICATE OF CORRECTION

PATENT NO.       : 8,642,940 B2
APPLICATION NO.  : 13/919331
DATED            : February 4, 2014
INVENTOR(S)      : Yasuyuki Takahashi and Mizuki Sato It is certified that error appears in the above-identified patent and that said Letters Patent is hereby corrected as shown below:

In the Specification:

Column 4, Line 44; Change "transitory" to --transistor--.

Column 9, Line 11; Change "TFTs is for" to --TFTs for--.

Column 16, Line 10; Change "bather" to --barrier--.

Column 17, Line 30; Change "111" to --TFT--.

Column 17, Line 60; Change "R, or B." to --R, G, or B.--.

Column 18, Line 61; Change "the substrate" to --the first substrate--.

Signed and Sealed this
Twenty-second Day of July, 2014

Michelle K. Lee
*Deputy Director of the United States Patent and Trademark Office*